US008786923B2

(12) United States Patent
Chuang et al.

(10) Patent No.: US 8,786,923 B2
(45) Date of Patent: Jul. 22, 2014

(54) METHODS AND SYSTEMS FOR RECORDING TO HOLOGRAPHIC STORAGE MEDIA

(75) Inventors: Ernest Y. Chuang, Boulder, CO (US); Kevin R. Curtis, Longmont, CO (US); Yunping Yang, Los Angeles, CA (US)

(73) Assignee: Akonia Holographics, LLC, Longmont, CO (US)

( * ) Notice: Subject to any disclaimer, the term of this patent is extended or adjusted under 35 U.S.C. 154(b) by 0 days.

(21) Appl. No.: 11/131,601

(22) Filed: May 17, 2005

(65) Prior Publication Data
US 2005/0254108 A1 Nov. 17, 2005

Related U.S. Application Data

(63) Continuation-in-part of application No. 10/658,055, filed on Sep. 8, 2003, now abandoned.

(60) Provisional application No. 60/429,012, filed on Nov. 22, 2002.

(51) Int. Cl.
*G03H 1/20* (2006.01)
*G11C 13/04* (2006.01)
*G11B 7/0065* (2006.01)
*G11B 7/28* (2006.01)
G11B 7/1372 (2012.01)
G03H 1/26 (2006.01)
G11B 7/26 (2006.01)
G03H 1/04 (2006.01)

(52) U.S. Cl.
CPC .... *G11C 13/042* (2013.01); *G11B 2007/13727* (2013.01); *G03H 1/2645* (2013.01); *G11B 7/26* (2013.01); *G03H 2210/33* (2013.01); *G03H 2001/0428* (2013.01); *G03H 1/20* (2013.01); *G03H 1/26* (2013.01); *G11B 7/0065* (2013.01);

*G03H 2001/0415* (2013.01); *G03H 2223/19* (2013.01); *G11B 7/28* (2013.01)
USPC .................................. 359/12; 359/1; 359/22

(58) Field of Classification Search
CPC ....... G03H 1/10; G03H 1/2645; G03H 1/265; G03H 2002/2645; G03H 2001/266
USPC ........ 359/10, 11, 12, 15, 16, 30, 35, 20, 21, 1
See application file for complete search history.

(56) References Cited

U.S. PATENT DOCUMENTS 3,644,012 A * 2/1972 Brooks .......................... 359/30
3,653,067 A 3/1972 Anderson et al.
(Continued)

FOREIGN PATENT DOCUMENTS

EP 1 422 698 A2 5/2004
EP 1 422 698 A3 5/2004
(Continued)

OTHER PUBLICATIONS

European Search Report mailed Oct. 13, 2006, issued for EP 03257404, two pages.
(Continued)

*Primary Examiner* — Audrey Y Chang
(74) *Attorney, Agent, or Firm* — Albert Haegele; Akonia Holographics, LLC

(57) ABSTRACT

According to one aspect and example, a method for recording holographic media and/or holographic master data masks includes recording at least a first hologram or information layer with a first holographic medium (e.g., a "submaster") and recording at least a second information layer with a second holographic medium (e.g., a second "submaster"). The first information layer and the second information layer from the first and second holographic media are then sequentially reconstructed and stored with a single holographic master medium (e.g., a "master"). The holographic master may then be used to record the stored first and second information layers into additional holographic media, for example, into HROM devices or the like.

18 Claims, 17 Drawing Sheets

(56) References Cited

U.S. PATENT DOCUMENTS

| | | | |
|---|---|---|---|
| 3,704,930 A * | 12/1972 | McMahon | 359/19 |
| 3,758,186 A * | 9/1973 | Brumm | 359/12 |
| 3,949,235 A | 4/1976 | Miyazaki et al. | |
| 4,318,581 A | 3/1982 | Guest et al. | |
| 4,677,629 A | 6/1987 | Lesh | |
| 4,715,683 A | 12/1987 | Gregory et al. | |
| 4,988,153 A * | 1/1991 | Paek | 359/15 |
| 5,016,953 A * | 5/1991 | Moss et al. | 359/9 |
| 5,202,875 A | 4/1993 | Rosen et al. | |
| 5,258,860 A | 11/1993 | Schehrer et al. | |
| 5,322,747 A | 6/1994 | Hugle | |
| 5,339,305 A | 8/1994 | Curtis et al. | |
| 5,411,296 A * | 5/1995 | Mallik | 283/86 |
| 5,422,746 A * | 6/1995 | Aharoni et al. | 359/16 |
| 5,483,365 A | 1/1996 | Pu et al. | |
| 5,510,912 A | 4/1996 | Blaum et al. | |
| 5,529,861 A * | 6/1996 | Redfield | 430/1 |
| 5,550,779 A | 8/1996 | Burr et al. | |
| 5,592,313 A | 1/1997 | Hart | |
| 5,650,247 A * | 7/1997 | Taniguchi et al. | 430/1 |
| 5,661,577 A | 8/1997 | Jenkins et al. | |
| 5,671,073 A | 9/1997 | Psaltis et al. | |
| 5,719,691 A | 2/1998 | Curtis et al. | |
| 5,727,226 A | 3/1998 | Blaum et al. | |
| 5,892,601 A | 4/1999 | Curtis et al. | |
| 5,920,536 A | 7/1999 | Campbell et al. | |
| 5,932,045 A | 8/1999 | Campbell et al. | |
| 5,933,515 A * | 8/1999 | Pu et al. | 382/124 |
| 5,949,558 A | 9/1999 | Psaltis et al. | |
| 5,973,807 A * | 10/1999 | Buchkremer et al. | 359/25 |
| 5,978,112 A | 11/1999 | Psaltis et al. | |
| 5,995,251 A | 11/1999 | Hesselink et al. | |
| 6,064,586 A | 5/2000 | Snyder et al. | |
| 6,081,912 A | 6/2000 | Richardson | |
| 6,108,110 A | 8/2000 | Orlov et al. | |
| 6,111,828 A | 8/2000 | McLeod et al. | |
| 6,191,875 B1 | 2/2001 | Curtis et al. | |
| 6,272,095 B1 | 8/2001 | Liu et al. | |
| 6,322,933 B1 | 11/2001 | Daiber et al. | |
| 6,366,369 B2 * | 4/2002 | Ichikawa et al. | 359/12 |
| 6,373,967 B2 | 4/2002 | Pu et al. | |
| 6,482,551 B1 | 11/2002 | Dhar et al. | |
| 6,538,776 B2 | 3/2003 | Edwards | |
| 6,611,365 B2 | 8/2003 | Edwards et al. | |
| 6,614,566 B1 * | 9/2003 | Curtis et al. | 359/24 |
| 6,798,547 B2 | 9/2004 | Wilson et al. | |
| 6,825,960 B2 | 11/2004 | Curtis et al. | |
| 6,914,704 B2 | 7/2005 | Shuman | |
| 6,930,811 B2 | 8/2005 | Brotherton-Ratcliffe et al. | |
| 7,092,133 B2 | 8/2006 | Anderson et al. | |
| 7,116,626 B1 | 10/2006 | Woods et al. | |
| 7,254,105 B2 | 8/2007 | El Hafidi et al. | |
| 7,742,209 B2 | 6/2010 | Curtis et al. | |
| 8,199,388 B2 | 6/2012 | Chuang et al. | |
| 2001/0035990 A1 * | 11/2001 | Mok et al. | 359/12 |
| 2003/0123116 A1 | 7/2003 | Shuman | |
| 2004/0179251 A1 | 9/2004 | Anderson et al. | |
| 2005/0036182 A1 | 2/2005 | Curtis et al. | |
| 2005/0270609 A1 | 12/2005 | Chuang et al. | |
| 2005/0286388 A1 | 12/2005 | Ayres et al. | |
| 2006/0002274 A1 | 1/2006 | Kihara et al. | |
| 2007/0053029 A1 | 3/2007 | Raguin et al. | |

FOREIGN PATENT DOCUMENTS

| | | |
|---|---|---|
| JP | 53-9816 | 4/1978 |
| JP | 8-506909 A | 7/1996 |
| WO | WO-94/12913 A1 | 6/1994 |
| WO | WO-02/095745 A1 | 11/2002 |

OTHER PUBLICATIONS

Author Unknown (Date Unknown). "Holograpic Confocal Microscope," located at <http://fyzike.fme.vutbr.cz/~chmelik/hclm/Parmode.htm>, last visted on Nov. 21, 2002, 4 pages.
Author Unknown. "How Does a Confocal Microscope Work?," located at <http://glinda.lrsm.upennedu/~weeks/confocal>, last visited on Nov. 21, 2002, 5 pages.
Barbastathls, G. et al. (1999). "Confocal Microscopy with a Volume Holographic Filter," *Optic Letters* 24(12):811-813.
Barbastathis, G. et al. (2000). "Volume Holographic Multiplexing Methods," In *Holographic Data Storage*, Springer-Verlag, Coufal, H. et al, eds., pp. 29-30.
Bryanston-Cross, P. (2002). "Technical Research: Holography," provided by Optical Engineering Laboratory, located at <http://www.eng.warwick.ac.uk>, last visited on Nov. 21, 2002, 2 pages.
Burr, G.W. et al. (2000). "Multiplexed Phase-Conjugate Holographic Data Storage with Buffer Hologram," *Optics Letters* 25(7):499-501.
Burr, G.W. et al. (2001). "Using Volume Holograms to Search Digital Databases," *SPIE Conference on Three-and Four-Dimensional Optical Data Storage*, Paper 4459-53.
Chuang, E. et al. (Jul. 8, 2002). "Holographic ROM System for High-Speed Replication," *Sony* AVIIT Development Group, Optical Disc. Dev. Div., Dept. 2, pp. 1-15.
Curtis, K. et al. (1994). "Three-Dimensional Disk Based Optical Correlator," *Optical Engineering* 33(12):4051-4054.
Curtis, K. et al. (1994), "Method of Holographic Storage Using Perlstrophic Multiplexing," *Optics Letters* 19(13):993-994.
Curtis, K. et al. (Date Unknown). "Backward Compatible Holographic ROM and Replication with Different Wavelength Then Readout," *InPhase Technologies Proprietary and Confidential*, pp. 1-4.
Dallas, W.J. (2001). "Part II: Chapter One Holography in a Nutshell," pp. 1-15.
Decision of the Technical Board of Appeal 3.4.2 of Dec. 19, 2001. Case No. T0041/00-03.4.2, Application No. 95104785.1, Publication No. 0676634 for Optical Inspection of Container Dimensional Parameters, by Owens-Brockway Glass Container, Inc., located at <http://216.239.37.100/search?g=cache:3hHBsl1vgA0C:legal.european-patent-office.org>, last visited on Nov. 22, 2002, 14 pages.
Gower, M., eds (1994), *Optical Phase Conjugation* Springer-Verlag Berlin Heidelberg, pp. vii-xii. (Table of Contents Only).
Kostuck, R. K. et al. (2000). "Beam Conditioning Techniques for Holographic Recording Systems," *Holographic Data Storage*, Coufal, H. J. et al., eds, Storage Springer-Verlag, pp. 259-269.
Li, S. (1994). "Photorefractive 3-D Disks for Optical Data Storage and Artificial Neural Networks," published by UMI Dissertation Services, Chapter 4, pp. 78-112.
Michalski, J. (Date Unknown). "What is Telecentricity?," provided by Edmund Industrial Optics®. located at <http://www.edmundoptics.com>, last visited on Nov. 22, 2002, 5 pages.
Miller, J.W.V. (1999). "Report Brief," describing a telecentric vision system for broach verification, located at <http://www.engin.umd.umich.edu>, last visited on Nov. 22, 2002, 4 pages.
Minsky, M. (1988). "Memoir on Inventing the Confocal Scanning Microscope," *Scanning* 10:128-128; also located at http://www.ai.mit.edu/people/minsky/papers/confocal.microscope.txt, last visited on Nov. 21, 2002.
Piazzolla, S. et al. (1992). "Single-Step Copying Process for Multiplexed Volume Holograms," *Optic Letters* 17(9):676-678.
Rhodes, R. T. (1979). "Hologram Copying," Chapter 9 In *The Handbook of Optical Holography*, Caulfield, H.J., ed, Academic Press, pp. 373-377.
Schnoes, M. et al. (Date Unknown). "Holographic Data Storage Media for Practical Systems," 9 pages.
Tao, S. et al. (1993). "Spatioangular Multiplexed Storage of 750 Holograms in an $FeLiNbO_3$ Crystal," *Optics Letters* 18(11):912-914.
Mok, F. et al. (2000). "Holographic Read-Only Memory" In *Holographic Data Storage*. H.J. Coufal et al. eds., Springer-Verlag: Berlin, Germany, pp. 399-407.
Japanese Office Action mailed on Jul. 6, 2007, for Japanese Application No. JP-2003-394801 filed Nov. 25, 2003, 8 pages (English translation 10 pages).
International Search Report and Written Opinion mailed on Mar. 17, 2008, for PCT Application No. PCT/US06/19236, filed on May 17, 2006, thirteen pages.
Non-Final Office Action mailed on Mar. 20, 2008, for U.S. Appl. No. 11/132,002, nineteen pages.

(56) References Cited

OTHER PUBLICATIONS

Supplementary European Search Report mailed on Sep. 23, 2009 for EP Application No. 06760095.7, filed on May 17, 2006, twelve pages.
Final Office Action received for U.S. Appl. No. 10/658,055, mailed on Feb. 28, 2007, 17 pages.
Final Office Action received for U.S. Appl. No. 10/658,055, mailed on Jul. 17, 2008, 12 pages.
Final Office Action received for U.S. Appl. No. 10/658,055, mailed on Oct. 20, 2005, 13 pages.
Non-Final Office Action received for U.S. Appl. No. 10/658,055, mailed on May 10, 2005, 12 pages.
Non-Final Office Action received for U.S. Appl. No. 10/658,055, mailed on Sep. 12, 2007, 18 pages.
Non-Final Office Action received for U.S. Appl. No. 10/658,055, mailed on Sep. 29, 2006, 19 pages.
European Office Action received for European Patent Application No. 03257404.8, mailed on Sep. 23, 2007, 10 pages.
Final Office Action received for U.S. Appl. No. 11/132,002, mailed on Jul. 28, 2010, 14 pages.
Final Office Action received for U.S. Appl. No. 11/132,002, mailed on Jun. 26, 2009, 11 pages.
Final Office Action received for U.S. Appl. No. 11/132,002, mailed on Mar. 28, 2007, 18 pages.
Final Office Action received for U.S. Appl. No. 11/132,002, mailed on Nov. 29, 2011, 11 pages.
Non-Final Office Action received for U.S. Appl. No. 11/132,002, mailed on Apr. 11, 2011, 12 pages.
Non-Final Office Action received for U.S. Appl. No. 11/132,002, mailed on Dec. 3, 2008, 8 pages.
Non-Final Office Action received for U.S. Appl. No. 11/132,002, mailed on Nov. 14, 2006, 14 pages.
Non-Final Office Action received for U.S. Appl. No. 11/132,002, mailed on Nov. 17, 2009, 10 pages.
Non-Final Office Action received for U.S. Appl. No. 11/132,002, mailed on Sep. 14, 2007, 16 pages.
Notice of Allowance received for U.S. Appl. No. 11/132,002, mailed on Mar. 7, 2012, 7 pages.
Final Office Action received for U.S. Appl. No. 12/102,642, mailed on Aug. 10, 2009, 14 pages.
Final Office Action received for U.S. Appl. No. 12/102,642, mailed on Aug. 6, 2010, 13 pages.
Final Office Action received for U.S. Appl. No. 12/102,642, mailed on Jan. 2, 2013, 7 pages.
Non-Final Office Action received for U.S. Appl. No. 12/102,642, mailed on Feb. 16, 2010, 12 pages.
Non-Final Office Action received for U.S. Appl. No. 12/102,642, mailed on Jun. 28, 2012, 8 pages.
Non-Final Office Action received for U.S. Appl. No. 12/102,642, mailed on Oct. 31, 2008, 15 pages.
International Preliminary Report on Patentability received for PCT Patent Application No. PCT/US2006/019236, issued on Mar. 17, 2009, 8 pages.
Non-Final Office Action received for U.S. Appl. No. 13/470,635, mailed on Feb. 27, 2013, 16 pages.
Office Action received for Japanese Patent Application No. 2008-127585 mailed on May 28, 2013, 8 pages (5 pages of English Translation and 3 pages of Official copy).
Non-Final Office Action received for U.S. Appl. No. 12/102,642, mailed on Jul. 1, 2013, 14 pages.

* cited by examiner

METHODS AND SYSTEMS FOR RECORDING TO HOLOGRAPHIC STORAGE MEDIA

CROSS-REFERENCE TO RELATED APPLICATIONS

The present application is a Continuation-in-part of earlier filed U.S. patent application Ser. No. 10/658,055, entitled, "METHODS FOR IMPLEMENTING PAGE BASED HOLOGRAPHIC ROM RECORDING AND READING," filed Sep. 8, 2003, which claimed benefit of earlier filed provisional application U.S. Ser. No. 60/429,012, entitled "A METHOD FOR IMPLEMENTING A PAGE BASED HOLOGRAPHIC ROM," filed on Nov. 22, 2002, both of which are incorporated herein by reference in their entirety.

BACKGROUND

1. Field

The invention relates generally to holographic data storage media and systems, and more particularly to methods and systems for recording and/or reading holographic storage media.

2. Description of Related Art

Holographic data storage systems store information or data based on the concept of a signal beam interfering with a reference beam at a holographic storage medium. The interference of the signal beam and the reference beam creates a holographic representation, i.e., a hologram, of data elements as a pattern of varying refractive index and/or absorption imprinted in a volume of a storage or recording medium such as a photopolymer or photorefractive crystal. Combining a data-encoded signal beam, referred to as an object beam, with a reference beam can create the interference pattern at the storage medium. A spatial light modulator (SLM) or lithographic data mask, for example, may create the data-encoded signal beam. The interference pattern induces material alterations in the storage medium that generate the hologram.

The formation of the hologram in the storage medium is generally a function of the relative amplitudes and polarization states of, and phase differences between, the signal beam and the reference beam. The hologram is also dependent on the wavelengths and angles at which the signal beam and the reference beam are projected into the storage medium. After a hologram is created in the storage medium, projecting the reference beam into the storage medium interacts and reconstructs the original data-encoded signal beam. The reconstructed signal beam may be detected by using a detector, such as a CMOS photo-detector array or the like. The recovered data may then be decoded by the photo-detector array into the original encoded data.

A basic holographic system is illustrated in FIG. 1. The holographic storage system includes a light source 110, for example, a laser for providing a coherent beam of light. A beam splitter 114 is positioned to split the laser beam into an object beam and a reference beam. The object beam is directed to an SLM or data mask 116 where it is encoded with information as a two-dimensional image and directed to the recording storage medium 124 by mirror 118 and lens 120 where it interferes with the reference beam directed via mirror 130. A complex interference pattern is recorded in the storage medium 124 where the object beam and reference beam interact. After a first image or layer is recorded, the system may be modified to enable additional images to be recorded in storage medium 124. For example, by modifying the angle and/or wavelength of the reference beam, successive images may be recorded in the storage medium 124.

A particular image may be retrieved from recording medium 124 with a reference beam similar to the original reference beam used to store the image. The light is diffracted by storage medium 124 according to the stored hologram and the two-dimensional image that was stored in recording medium 124 is directed by lens 126 to photo-detector array 128.

Holographic Read Only Memory (Holographic ROM or HROM) storage media are well known. In the past, holographic information has been recorded in disc format HROM in an incremental manner by successively aligning different locations on the HROM with an object beam and a reference beam to record successive data bits. Different information can be recorded at each successive location by changing the information imparted through a spatial light modulator (SLM) or successive data masks, for example. U.S. Pat. No. 6,272,095, entitled, "Apparatus and Method for Storing and/or Reading Data on an Optical Disk," by Liu et al. describes several examples of illustrative prior recording techniques, and is incorporated herein by reference in its entirety. Moreover, multiple holograms can be stacked in virtual image layers through wavelength multiplex, angle multiplex, shift multiplex, confocal multiplex, or other multiplex techniques, for example. Each hologram in a stack may comprise a page of information, where a "page" is a collection of bits or of pixel data stored together, e.g., as a 2048×2048 array or a 10×10 array. U.S. Pat. No. 6,322,933, entitled, "Volume Track Definition for Data Storage Media Used to Record Data by Selective Alteration of a Format Hologram," by Daiber et al. describes several examples of illustrative prior volume recording techniques, and is incorporated herein by reference in its entirety. Additionally, another reference that describes recording techniques and the bitwise retrieval of an HROM includes "Holographic ROM System for High Speed Replication," presented by Ernest Chuang et al. of Sony Corporation at the Optical Data Storage Conference, Jul. 8, 2002, in Hawaii, USA.

One shortcoming of such methods for the recording of holograms is that significant time can be required to incrementally record information on a location-by-location or bit-by-bit basis. Therefore, improved recording processes have been proposed in which an entire holographic image or "layer" of information is recorded simultaneously across an entire storage medium. An exemplary method includes shining a planewave beam through a transmissive optical medium, e.g., a transmissive lithographic data mask, encoded with information so as to create a planewave object/signal beam. The encoded planewave object beam illuminates one surface of the storage medium. A conical planewave reference beam, for example, may illuminate an opposite surface of the holographic storage medium. The object beam and the reference beam interfere within the holographic storage medium to create an information layer within the storage medium.

Readout of the data stored on the media may be subsequently achieved using the same reference beam used to record the data or by using a conjugate readout beam (i.e., similar to the original reference beam propagated in the opposite direction) to reconstruct a backwards-propagating signal beam that retraces the path of the original recording. The stored information is readout in a bitwise fashion, e.g., a bit at a time or a few bits at a time in a serial fashion as described in the Sony Corporation approach referenced above. A pickup lens of a system may focus a real image of the data, created using the readout beam, onto a suitable detector as the holographic medium and/or the drive translate and/or rotate with respect to each other.

One shortcoming of the recording methods described above is that information typically is readout a bit at a time or a few bits at a time in a serial fashion. Thus, there is a need for recording holographic storage media that more readily permits relatively higher, parallel readout rates. Specifically, there is a need for parallel readout of at least a page of information at a time, e.g., many bits in parallel. In addition, the bit-by-bit readout architecture generally limits the implementation to spinning disks in order to get reasonable transfer rates. There is a need for page-wise readout that may allow for new more compact, portable formats such as storage cards to be practical. Another shortcoming of the prior proposed recording methods includes the alignment and time necessary to align and record multiple data masks in holographic storage media, e.g., HROM media.

BRIEF SUMMARY

In one aspect of the present invention, methods and systems for recording holographic storage media are provided. In one example of this aspect, a method includes illuminating an object (e.g., a data mask or SLM) with an object beam (often referred to as a "signal" beam) and recording the resulting modulated object beam in a holographic storage medium. In one example, the data mask includes an information layer that is divided into multiple data pages. A reference beam is further propagated to the holographic storage medium to record the multiple data pages of the information layer in a parallel fashion with the holographic storage medium.

In another aspect, a method and system for recording holographic media where an object image is magnified is provided. In one example, a system includes a light source, an object for modulating an object beam from the light source, and a relay system adapted to magnify or demagnify the modulated beam (e.g., an image of the object) to an output image. The output image is directed to the holographic storage medium, where a reference beam is also directed, to record the resulting interference pattern. Additionally, the relay system converges the output image to an output Fourier plane, which may be disposed within the holographic storage medium. In one example, a filter may be placed at an intermediate Fourier plane located prior to the output Fourier plane. Further, a phase mask may be placed at the position of the output image in one example. The object may include an SLM operable to modulate the object beam with an information layer comprising a plurality of data pages. In other examples, the relay system may be used without magnifying the object beam, and may provide the benefits of an intermediate Fourier plane or phase mask disposed at the output image.

In another aspect described herein, methods and system for recording holographic media and/or holographic master data masks are provided. In one example of this aspect, a method includes storing at least one information layer in a holographic master data mask, illuminating the holographic master data mask to reconstruct the stored information layer and direct an image of the information layer to a holographic storage medium, and propagating a reference beam to the holographic storage medium to record the information layer therein.

In another example, a method for recording holographic media and/or holographic master data masks includes recording at least a first hologram (e.g., an information layer) with a first holographic medium (e.g., a "submaster") and recording at least a second hologram with a second holographic medium (e.g., a second "submaster"). The first hologram and the second hologram from the first and second holographic media are then sequentially reconstructed and stored with a single holographic master medium (e.g., a "master"). The holographic master medium may then be used to record the stored first and second holograms into additional holographic media, for example, into HROM devices or the like. The exemplary method of using holographic submasters to create a holographic master data mask may provide benefits in terms of diffraction efficiencies of stored information layers and increased storage capacity of the final holographic storage device.

In another aspect of the present invention, various methods for reading holographic media are provided. In one example, a method for reading holographic storage media includes providing a reference beam and detecting stored information in a holographic storage medium with a detector placed at a distance from the holographic storage medium. In one example, the holographic storage medium includes at least one information layer divided into a plurality of data pages stored therein and adapted to be detected at the distance of the detector (e.g., lenses or other optical elements may not be needed for readout).

The present invention is better understood upon consideration of the detailed description below in conjunction with the accompanying drawings and claims.

DETAILED DESCRIPTION

Figure 1:
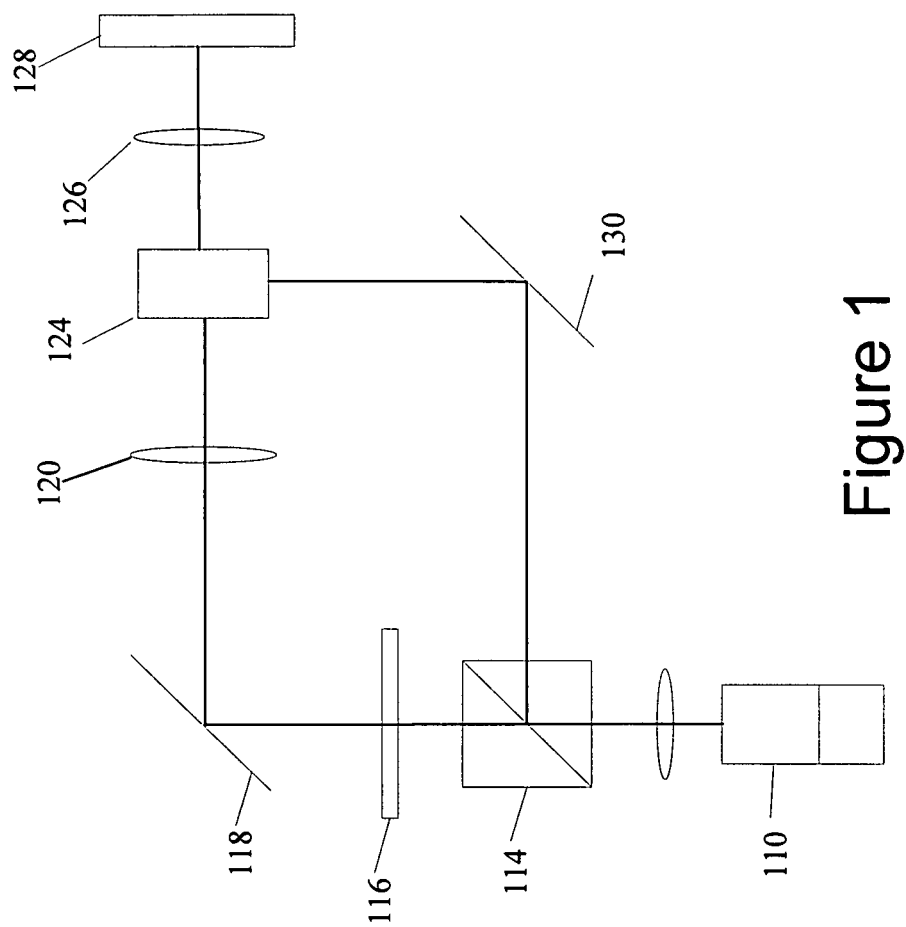
FIG. 1 illustrates an exemplary holographic recording and reading system.

Methods and systems are provided for holographic storage media recording and reading including, for example, holographic read only media or HROM media. The following description is presented to enable any person of ordinary skill in the art to make and use the various examples. Descriptions of specific techniques and applications are provided only as examples. Various modifications to the examples described herein will be readily apparent to those of ordinary skill in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

In one aspect of the present invention, data masks are used to record virtual layers or holographic images having a plurality of data pages centered at different locations on a holographic storage medium such that readout may be achieved in a page-wise fashion. In one example, parallel recording of multiple data pages in each layer allows for the fast replication of HROM media with increased storage capacity, and page-wise readout of HROM media allows for faster read rates than bitwise readout. The increased storage capacity is due in part to increased diffraction efficiency by recording multiple data pages in the storage media in parallel. The data transfer rates are increased in part because of parallel detection of an entire data page without moving the media as in serial storage devices such as CDs, magnetic disks, and the like. The examples are particularly suited for making high performance card storage devices; however, the examples are applicable to various storage device media and configurations such as discs and tape media as will be appreciated by those of ordinary skill in the art.

In another aspect of the present invention, one or more data masks are stored in a holographic medium to create a holographic master data mask (sometimes referred to herein as a "master" or "master holographic medium") for use in recording holographic storage media. In one example, a holographic master data mask is fabricated with multiple information layers or data layers and used to record or copy one or more of the stored data layers to a holographic storage media such as HROM media. The holographic master data mask may be multiplexed to retrieve the various data masks with improved alignment and speed between recording different layers without the need to move and align a plurality of data masks. Additionally, the holographic master data mask may be placed at or near a quasi Fourier transform plane of the stored data masks using a VanderLugt setup or other transforming optical system. Holographic master data masks may be recorded at or near Fourier planes or image planes of the optical system. The Fourier transform location in these systems may filter out high order transform components during recording the holographic master data mask, and reduce interference between stored data pages when recording an HROM or the like, thereby improving readout performance.

In another aspect of the invention, holographic recording methods and systems for forming holographic master media using a plurality of submaster holographic media are provided. In one example, a method includes recording a set of desired holograms sequentially into a plurality of separate holographic media, e.g., a plurality of "submasters." Thereafter, the holograms recorded in the submasters are copied to a second holographic storage medium, a "master." The master holographic medium may be used as a master data mask or the like to replicate further holographic storage media. The exemplary method may provide increased storage capacity and hologram diffraction efficiencies in a holographic medium over conventional methods and systems.

In another aspect of the invention, a holographic recording method and system include an optical relay system disposed in the object beam path to magnify or demagnify an input object image to an output object image. The magnification of the relay system may be adjusted to magnify the object image size to a desired output image size to be stored and later reconstructed from a suitable holographic medium. For example, the object image may be magnified to a desired pixel size and pitch varying from that of the object.

Additionally, exemplary methods and systems including a relay system lend themselves to further advantages (including examples that relay the object image without magnification). For example, a phase mask may be placed at the output image plane. Further, in one example, the light path for the output image of the relay system converges to an output Fourier plane and an intermediate Fourier plane may be included prior to the output Fourier plane. A filter (e.g., including an aperture for polytopic multiplexing) may be placed at the intermediate Fourier plane, thereby allowing the output Fourier plane to be placed inside the storage medium.

In another aspect of the invention, where one or more data mask are stored in a holographic medium or a holographic master data mask, the data pages are multiplexed in stacks using multiplexing techniques such as wavelength or angle multiplexing. Additionally, the data pages may be stored spatially overlapping using polytopic multiplexing. Polytopic multiplexing is described, e.g., in U.S. Patent Application 60/453,529, filed on Mar. 10, 2003, and entitled, "A METHOD FOR OVERLAPPING HOLOGRAMS USING LOCATION BASED FILTERING TO SEPARATE OUT THE SIGNAL," which is hereby incorporated by reference as if fully set forth herein.

The following description includes various examples and aspects of the present invention. As will be recognized by those of ordinary skill in the art various examples may be used alone or in combination with various other methods and systems depending on the particular application.

Volume holography can be used to multiplex multiple layers in the same holographic storage medium. For instance, a first transmissive mask medium or data mask may be encoded with a first information layer, and a second transmissive mask medium may be encoded with a second information layer. Information from the first and second transmissive mask media can be multiplexed onto the holographic storage medium through angle or wavelength multiplex techniques, for example. In this manner, multiple transmissive mask media, each encoded with different information, can be used to produce multiple information layers. That is, stacks of holograms can be created in which information stored at different layers in a given stack are created by different or successive transmissive mask media. The use of the term "layer," in a stack is a logical explanation or term as the physical reality of volume holographic recording is that all holograms in a stack exist in the same or nearly the same volume and not in physically separate layers in the media.

In one exemplary recording method, multiple data pages included in a single hologram image or information layer are recorded in parallel in at least a portion of a holographic storage medium. Further, multiple layers may be recorded to the holographic storage medium to create multiple stacks of data pages (often referred to as "books" of data pages).

Figure 2B:
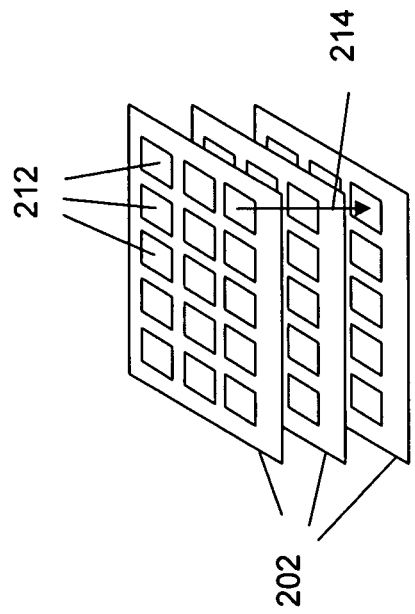
FIG. 2B illustrates an exemplary stack of information layers having multiple data pages in each layer.
Figure 2A:
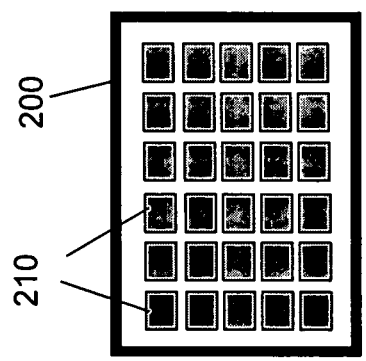
FIG. 2A illustrates an exemplary data mask including multiple data pages.

FIG. 2A illustrates an exemplary data mask 200 including a plurality of data pages 210. Each data page 210 may include an array of pixels numbering in the hundreds of pixels or more. For example, each data page 210 may include a 2048 by 2048 array of pixels, but various sizes and shapes of each data page 210 are possible. Each data page may be separated within data mask 200 and storage media by a distance equal to a few microns or larger. Alternatively, if polytopic multiplexing is used, for example, the data pages may overlap within the storage media as described in greater detail below.

FIG. 2B illustrates an exemplary representation of hologram images or virtual information layers 202 having multiple data pages 212 of information that may be stored in a holographic storage medium by data mask 200. Each layer 202 may be stored onto a portion or all of a holographic medium at the same time such that multiple data page 212 of a common layer are recorded in parallel. Further, multiple layers 202 may be aligned with data pages 212 forming a stack 214 of data pages 212, where one stack 214 is indicated generally by the arrow. During readout, a detector may be aligned with a stack 214 of one or more data pages 212 in a storage medium and each data page 212 detected or readout successively in a page-wise fashion. For example, each layer 202 and data page 212 of a stack 214 may be multiplexed into the media by angle, wavelength, or other suitable methods and readout accordingly. When an entire stack 214 has been read, the detector and/or media may be translated and/or rotated to align the detector with another stack 214 and page-wise readout continued. In another example described below, referred to as polytopic multiplexing, data pages 210 may spatially overlap when stored.

Storing an information layer 202 including multiple data pages 212, across a holographic storage medium may more effectively utilize the dynamic range of holographic media, thereby increasing the storage capacity of the media. Generally, the storage capacity and diffraction efficiency decrease as the number of holograms, in this instance, information layers 202, are stored in similar locations of the volume medium. For example, diffraction efficiency is proportional to $1/m^2$, where m is the number of holograms stored therein. When multiple data pages are recorded in a medium in parallel as part of a single image, however, the diffraction efficiency reduction occurs only once for each layer 202 of multiple data pages 212, i.e., m=1, rather than a reduction for each data page 212 recorded within the holographic storage medium. Typically, recording all data pages 212 in layer 202 in parallel results in or allows for higher storage density due to improved uniformity of exposure of the medium and better use of the medium volume. In contrast, if each data page 212 is recorded by itself in a serial fashion, the process will use more dynamic range of the medium than when each data page 212 is recorded at the same time, i.e., in parallel. The difference in dynamic range is due, at least in part, to overlap of the signal beam and reference beam exposing more medium with propagation through the medium. This results in more effective exposures to record the same information during serial recording and uses a greater dynamic range of the medium than parallel recording. In addition, localized serial recording of data pages 212 may create localized bulk index changes that can lower the signal-to-noise ratio (SNR) of the system compared to parallel recording an entire layer 202.

Additionally, faster readout times may be achieved with the exemplary methods. During readout of a holographic storage medium with multiple data pages 212 in each layer 202, a system may align a detector with a data page 212 or a stack 214 of data pages 212 and readout the data pages 212 in a page-wise fashion, e.g., where the array of information stored in each data page 212 is readout in parallel. In one example, a detector is aligned with a stack 214 and the entire stack 214 of data pages 214 is readout page-wise (through multiplexing, etc.). The detector may then move to another stack 214 of the storage medium to readout data pages 212. Reading in a page-wise fashion may substantially increase the readout rate compared to methods and systems where readout is performed in a serial or bitwise fashion.

Further, detecting an entire data page 212 in parallel allows for page-wise error correction methods. For example, detecting an image of a data page 212 allows for various error correction and channel modulation techniques to recover detected signals and decode them into the storage information with greater accuracy. For example, U.S. patent application Ser. No. 10/305,769 entitled "MICRO-POSITIONING MOVEMENT OF HOLOGRAPHIC DATA STORAGE SYSTEM COMPONENTS," describes several error correction methods and techniques and is hereby incorporated by reference in its entirety.

Figure 3:
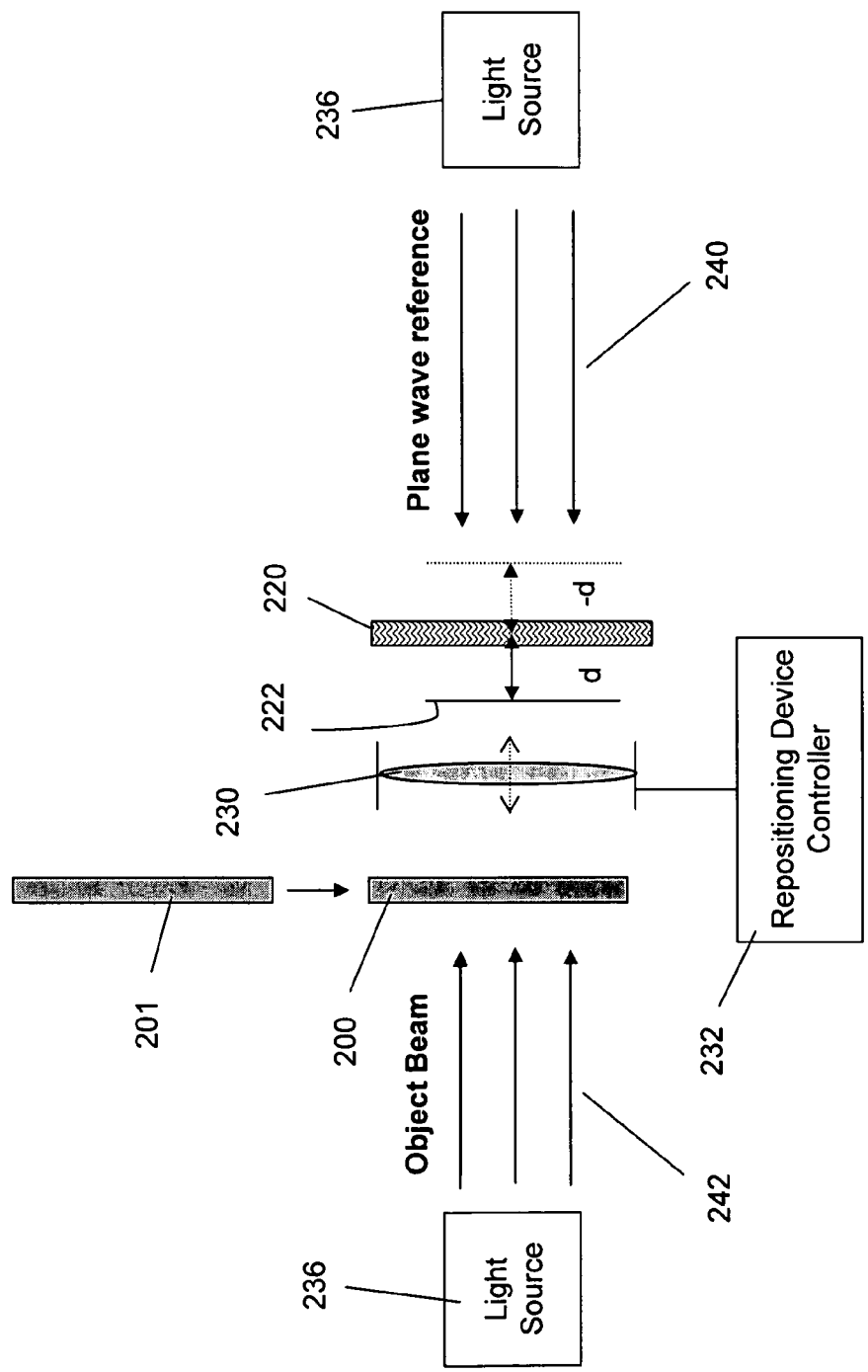
FIG. 3 illustrates an exemplary holographic data recording system for creating holographic master data masks or holographic media.

FIG. 3 illustrates a portion of an exemplary system for recording data mask 200 including multiple data pages onto holographic storage medium 220 where the multiple data pages are advantageously recorded in parallel. The exemplary systems shown and described herein may include various additional or different optical elements such as lenses, prisms, apertures, filters, beam splitters, gratings, and the like as will be recognized by those of ordinary skill in the art. For clarity, however, such additional features have been omitted from the description.

In this example, data mask 200 is illuminated by an object beam 242 provided by light source 236 and interacts with a reference beam 240 provided by light source 236. Light source 236 may include any suitable light source such as a laser or other coherent light source. Further, object beam 242 and reference beam 240 may be provided by the same or different light sources. The exemplary recording method is shown in a reflection geometry holography process configuration (object and reference beam entering the media from opposite sides), where the plane wave reference beam interferes with the data encoded object beam inside the holographic storage medium 220. The system illustrated may be configured in various manners and include various other features not explicitly described herein as will be recognized by those of ordinary skill in the art. For example, it should be readily recognized that transmission geometry holography processes may also be used to store the information of data mask 200, where the plane reference wave beam is provided from the same side of the medium 220 as the data mask 200. Additionally, the optical system in the object beam path may include a single lens 230 as shown, no lenses, or a plurality of lenses.

In this example, data mask 200 is illuminated by object wave 242 from light source 236 and is propagated in a transmissive system to image plane 222 that is a distance "d" from the holographic storage medium 220 center. The distance d can be positive, zero, or negative, i.e., on the other side of storage medium 220 shown in dotted lines. Image plane 222 may also be located within storage medium 220. One potential advantage of holographically implementing multiple layers (image planes) is that the layers do not have to physically be on the storage medium. For example, with current multi-level CD, near-field, or high na systems, the layers are on or inside the media. By imaging or placing the data mask 200 of the data, the layers can appear to a detector or drive as being located outside of the storage medium 220, inside storage medium 220, or on storage medium 220 depending on where the data mask 200 image plane 222 lies during recording. Thus, the usual problem of compensating for spherical aberration due to the change in the amount of substrate that the light travels through may not be necessary and in some instances may be detected without a pickup lens or lenses. In addition, by placing the image plane 222 of the data outside of the storage medium 220, various media defects or contamination issues such as dust, scratches, and the like may be mitigated.

Further, when imaging, a lens system 230 can change the magnification of the mask both to either magnify (enlarge) or demagnify (shrink). In one example, lens 230 demagnifies the image by ten. Lens system 230 may include one or more optical elements including lenses, lens arrays, prisms, beam splitters, and the like. Further, data masks may be recorded without lenses by placing the data masks 200 near to the media, for example, at a distance d from medium 220 and recording at this location.

Data mask 200 may be propagated to a holographic storage medium in any suitable manner. In the case of multiple data masks 200, successive data masks 200 and 201 may be stored in the holographic storage media utilizing a procedure in which each data mask 200, 201, and so on, is effectively multiplexed for readout purposes. In one example for recording multiple pages of data mask 200 in parallel, data mask 200 is Fourier transformed onto the medium 220 with a lens array including a lens element for each data page 210.

Figure 5A:
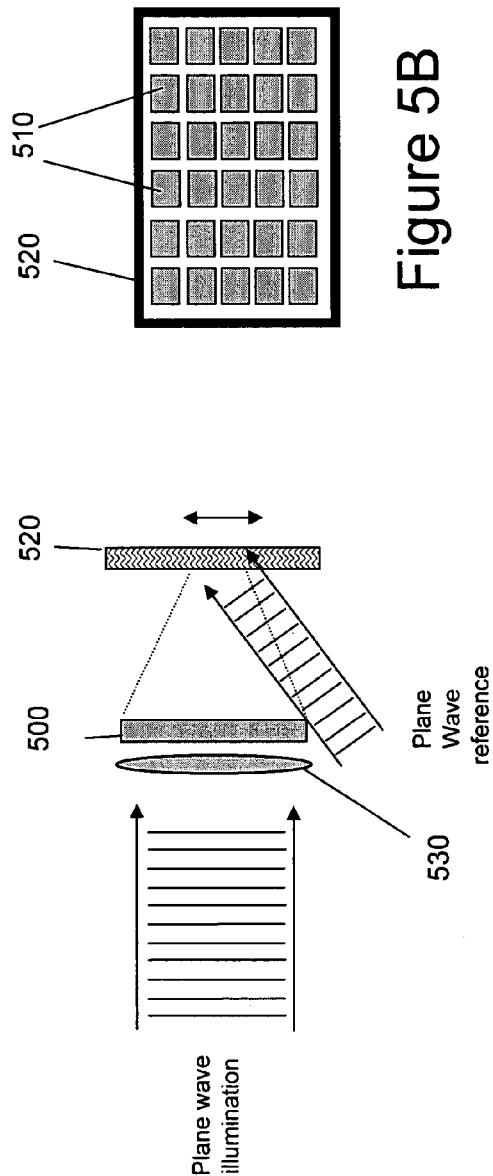
FIGS. 5A and 5B illustrate an exemplary system for recording a master holographic data mask.

Methods for recording multiple data pages of data mask 200 in parallel may further include a VanderLugt imaging system. For example, a VanderLugt imaging system generally includes or is characterized by having lens 230 before the data mask 200 such that the data mask 200 is illuminated by a converging beam. FIG. 5A, described below, includes an exemplary VanderLugt imaging configuration. The VanderLugt system is preferred in that it allows the storage medium 220 to be in or near the Fourier transform plane, and when used, e.g., with phase conjugate readout the image plane is generated without the need of a lens. Storage medium 220 may also be placed near the Fourier transform plane to enable an aperture to filter out high order transform components during recording. Further, the Fourier transform plane may be contained within the media, or near the media depending on the particular application. If the Fourier transform plane is within the media, the Fourier plane filtering may be done at another Fourier plane in the relay system. In addition, phase masks or other elements to lower the DC spot energy relative to the rest of the orders intensity may be included to allow for better recording of the information.

In one exemplary method of wavelength multiplexing, the wavelength of the beams 240, 242 may be changed and a new data mask 201 with data pages that have different information stored. Additionally, data mask 201 may include a holographic data mask having one or more layers may be used (as will be described below). In one example, a tunable laser device may be included, for example, where the wavelength may be varied by tuning the temperature of a diode as described in U.S. patent application Ser. No. 10/346,399, entitled, "System and Method for Bitwise Readout Holographic ROM," which is hereby incorporated by reference as if fully set forth herein. Additionally, a series of discrete laser sources with varying wavelengths may be used. Other methods for implementing various wavelengths in a system include techniques developed for telecom applications. For example, these include electroabsorptive modulation and the use of a micro-electro-mechanical systems (MEMs) structure on a laser cavity to change the wavelength. Central wavelengths of interest can be anywhere between 350-950 nm, and practical tuning ranges of interest can be as small as 1 nm. A preferred range of tenability is between approximately 5 nm and 15 nm. The readout laser may include a continuous wave or pulsed beam. A pulsed beam is generally more efficient in using energy. Angle multiplexing may also be achieved by varying the angle of incidence of the reference beam. Additionally, phase code, polytopic, shift, correlation, or other known multiplexing methods may also be used alone or in combination.

In another example, confocal multiplexing may be implemented by varying the image plane 222 distance d between recording successive data masks 200 and 201. Distance d may be varied through a repositioning device controller 232 that translates lens 230 in a direction perpendicular to data mask 200, along the optical axis of lens 230 to vary the location of d between successive layers. The repositioning device may include any suitable device capable of translating lens 230 (or multiple lenses) and controlled by a suitable microprocessor. This could also be implemented by moving the mask between successive layers. On readout, the detector may be similarly varied by a repositioning device to image and detect the stored images. For example, changing the wavelength for wavelength multiplexing or changing the location of the detector for confocal multiplexing. Additionally, for confocal multiplexing it is generally desirable to have a filter such as an array of pinholes at the image plane, i.e., on the detector array or at an intermediate image plane, to filter out noise from the other confocally stored holograms. These, and other multiplexing techniques well known in the art, can be implemented alone or in any combination to achieve high-density storage and capacity within storage medium 220.

An advantage of confocal multiplexing includes that the data mask 200 may be moved over a distance, e.g., 100 microns or more, without significant loss of image quality and without magnification change, provided that the optical system is close to telecentric. By filtering out other data pages on a per pixel basis with a pinhole filter similar to confocal microscope, the multiple pages in the stack can be recorded at different depths. This can significantly increase the density that may be stored in the holographic medium 220. Confocal multiplexing may also be combined with Bragg based, e.g., angle, wavelength, shift, and/or momentum based multiplexing techniques, e.g., fractal, aperture, peristrophic, to increase storage density.

Data mask 200 may include a phase mask, amplitude mask, or any combination of amplitude and phase mask, where phase and/or amplitude represents data. For example, binary information can be stored as (1,0) or (1,−1,0), and detected as 1,0 on any suitable detector such as a CCD image sensor, CMOS image sensor, or other suitable sensor such as an area array sensor. Data mask 200 may contain information similar to that found on conventional DVD disks, including light and dark spots corresponding to 1s and 0s, data tracks, and servo patterns in the data.

Data mask 200 may be fabricated through any suitable lithographic method as known in the art. Alternatively, an SLM or holographic storage medium may be used to encode an object beam. In one example, one or more data masks 200 having a layer with multiple pages may be holographically stored in a holographic medium as a holographic master data mask and used to store data into the holographic storage medium, e.g., an HROM. The holographically stored layer may be imaged to the HROM, and in the case of multiple pages, multiplexed to the HROM to store each hologram having multiple pages as will be described in greater detail below.

In one example, the holographic storage media 220 may include a card medium such as a high performance card storage device or the like. Alternatively, the storage medium 220 may include disc media similar to or different from conventional CD or DVD media, tape, or any other convenient format in which optical media may be fabricated. Generally, the holographic storage medium 220 includes a photopolymer on or between protective substrates. The protective substrates are advantageously selected from glass, sapphire, polycarbonate, poly(methyl methacrylate) or PMMA, plastic, quartz, or other suitable material that is generally transparent to the wavelength of light being used, and which has adequate mechanical properties in the holographic storage system. Alternatively, the storage medium may be enclosed at least partially within a cartridge or other protective structure.

The photopolymer layer may include a photopolymer material that is capable of recording the desired interference pattern. One exemplary holographic medium includes Tapestry™ media manufactured by InPhase Technologies, but any volumetric media capable of recording holograms may be used. Other examples of photopolymers and storage media include those described in U.S. Pat. No. 6,482,551, which is hereby incorporated herein in its entirety by reference. It is also desirable that the optical quality of the media be fairly high, e.g., <4 wavelength of power per $cm^2$, to achieve good image reconstruction and good Bragg selectivity. U.S. Pat. No. 5,932,045 describes an exemplary method for fabricating exemplary media and is incorporated herein in its entirety by reference.

Figure 4:
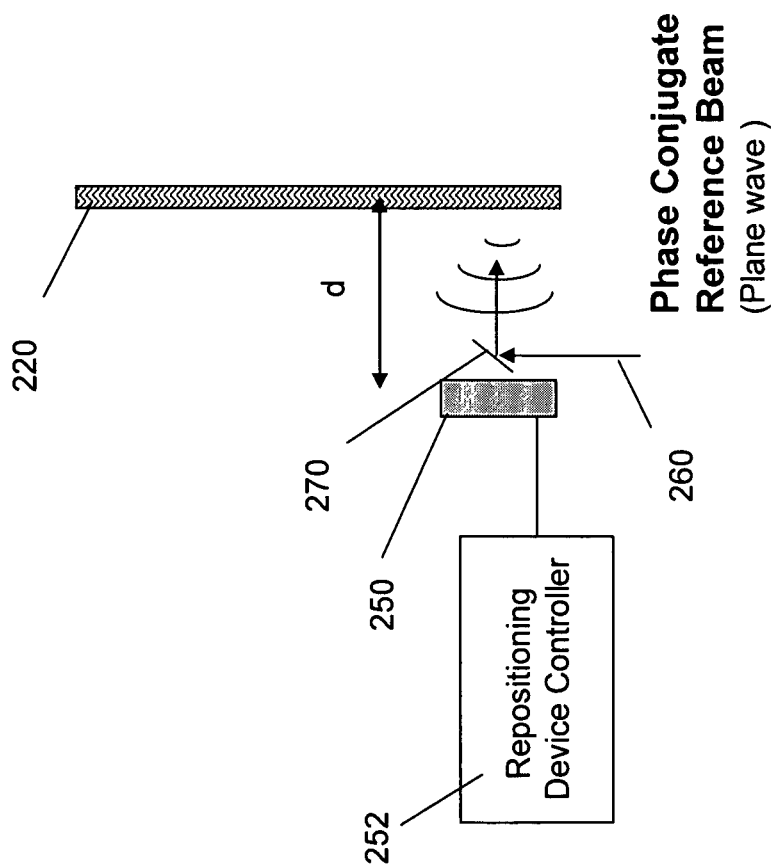
FIG. 4 illustrates an exemplary system for detecting holographic data directly with a detector.

FIG. 4 illustrates an exemplary system for reading holographic storage media, for example, storage medium 220 recorded using the system of FIG. 3. Readout of data stored in storage medium 220 may be achieved in many different ways. For example, a phase conjugate reference beam can be used with a reference wave the size of a single page or stack of holograms (for a plane wave reference beam this may include a plane wave in the opposite direction). A reference beam 260 may be introduced and deflected to the media by a beamsplitter 270. Beamsplitter 270 may include a standard beamsplitter, a polarizing beamsplitter, or a holographic optical element that redirects the reference beam 260 to storage medium 220. The use of an aperture or angle filter (to just pass the zeroth order or some fraction of the zeroth order) between beamsplitter 270 and storage medium 220 may be used to get an appropriate sized beam and filter out the other data pages. Such a filter or aperture could also be part of the media structure itself.

In one example, where the image was stored outside the storage medium 220 at distance d, a suitable detector 250 can be placed at the image plane distance and the data page detected without the need for an optical lens or other optical elements. Repositioning device controller 252 may be used to vary the distance between detector 250 and storage medium 220 through a suitable repositioning device to read different data pages stored at different distances d in the stack by translating detector 250. Alternatively or additionally, repositioning device controller may also translate the position of storage medium 220 through a suitable repositioning device.

Further, detector 250 and storage medium 220 are capable of moving parallel to each other to align detector 250 with other data pages and stacks of storage medium 220. For example, the other stacks of holograms may be accessed by moving detector 250 and the reference beam illumination to the stack that is desired. Conversely, the media could be moved to the stack location or a combination of head and media movement as in Compact Disk (CD) or Digital Versatile/Video Disk (DVD) systems.

The cost and/or compactness of the exemplary system, for example, a read drive without a pick-up lens or the like, may be greatly improved in this manner. It should be understood that the exemplary system depicted may include various other devices and elements including optics such as a lens or the like. For example, various lenses, apertures, filters, gratings, and the like may be used to image data pages to the detector as are known in the art.

In one example, detector 250 includes the same number of pixels as a single data page stored in storage medium 220. Detector 250 may include an appropriate pixel size depending in part on the data mask pixel size used to store the data page and the optical system magnification, if any. In other examples, the detector 250 may include more pixels of a smaller size than the stored image allowing detector 250 to over sample the stored image. Detector 250 may include any suitable detector such as a CMOS image sensor, a CCD image sensor, or the like that are sensitive to optical information. Further, a decoding unit coupled to detector 250 may determine the corresponding values of the recovered data.

In various examples, a detector may also include a line detector CCD or CMOS line sensor. A line detector can be scanned (physically moved across the image) to readout an entire data page, which could be the size of the storage medium or any faction of the storage medium. The data pages could be multiplexed and readout in a page wise fashion and detected with a line camera. The data pages can also be detected in a similar fashion with a CMOS or CCD camera or other such camera that contains an array of pixels to detect the reconstructed data page.

The holograms in a stack, i.e., data pages multiplexed at the same location of storage medium 220, can all be readout by changing the reference beam in the manner used to store them. For example, changing the wavelength for wavelength multiplexing or changing the location of the detector for confocal multiplexing. Additionally, for confocal multiplexing it is desirable to have a filter such as an array of pinholes at the image plane, i.e. on the detector array or at an intermediate image plane, to filter out noise from the other confocally stored holograms. In an example where a lens or other optical elements are used during readout, the filter may be at an intermediate image plane location before the detector.

In another example for reading holographic storage media, e.g., HROM media, various data pages may be readout without using the phase conjugate readout. This can be done with and without lenses in the drive as well. For example, with reference again to FIG. 3, if a hologram or layer is stored at a distance −d (image on the opposite side of storage medium 220 shown in dotted lines) then the same reference beam shown in FIG. 3 may be used to readout the layers of data. The holograms will appear as images a distance −d from the media (other side of media). Thus the detector can be place at location −d. Various optical elements including pick-up lenses may also be used to image or transform as desired and is well understood by those of ordinary skill in the art.

Various examples herein may include multiplexing multiple pages to get to high storage density in a holographic storage media or holographic master data mask. For example, wavelength, angle, confocal (storing at different distances from center of media), peristrophic, polytopic, and the like. Further, one or more of the multiplexing technique may be combined to increase storage density, e.g., (wavelength, confocal), (angle, confocal), (wavelength, polytopic) or all three. Additionally, data page(s) and layer(s) may be combined with visible image(s) for security purposes and the like.

Other exemplary holographic data storage systems that may be used in conjunction with various aspects of the present invention include those described in U.S. Pat. No. 5,920,536 entitled, "Method and Apparatus for Holographic Data Storage System," U.S. Pat. No. 5,719,691, entitled, "Phase Correlation Multiplex Holography," and U.S. Pat. No. 6,191,875 entitled, "Process for Holography Using Reference Beam Having Correlated Phase Content," all of which are incorporated herein by reference in their entirety.

In another aspect of the present invention, one or more data masks are recorded in a holographic master data mask. The holographic master data mask may then be used to record multiple holographic layers in a holographic storage media, such as HROM storage media or the like. For example, the holographic master data mask may be used to holographically record an entire information layer across a holographic storage medium. Each layer may be divided into multiple data pages of information to be recorded in parallel. Multiple layers may be multiplexed onto a medium using wavelength, angle, peristropic, confocal, polytopic, phase-code, or other multiplex techniques. In producing the holographic master data mask, data pages and stacks of data pages can be carefully aligned and recorded in the holographic master data mask, and the alignment maintained by using the holographic master data mask to replicate holographic storage media. For example, rather than aligning successive data masks, the various data masks to be recorded may be aligned and then recorded into a holographic master data mask by wavelength or angle multiplexing. The correct data mask may be recalled with the appropriate wavelength or angle when it is desired to be imaged and stored. This makes the interchange of data masks very quick and easy during the replication process allowing for fast cycle times. On readout of the media, the alignment of the pages and stacks of pages created by the holographic master data mask may be increased such that readout is improved with minimal time for mechanical alignment and servo in the drive between different pages of a stack. Additionally, careful alignment of layers or between stacks of data page in a layer may be used to detect fake, unauthorized, or pirated storage media. For example, by intentionally varying the alignment or holding a particular alignment between page stacks or between layers in a predetermined way, a signature of a valid storage medium may be generated in the medium itself.

FIG. 5A illustrates an exemplary system for recording data masks into the master holographic data mask. In this example, holographic master data mask 520 is placed near a quasi Fourier transform plane of data mask 500 to be stored therein. Further, the exemplary system may include a VanderLugt imaging setup to achieve the quasi Fourier transform placement. A polytopic filter may also be included in the exemplary system.

A plane wave illuminates data mask 500, which may include an SLM, lithographic data mask, or other suitable object, and stores a hologram to a portion of holographic master data mask 520. In this instance, the plane wave passes through a lens 530, e.g., a converging lens. A plane wave reference beam is also incident on the holographic master data mask 520 and may be varied, e.g., wavelength or angle, to record multiple data masks in holographic master data mask 520. The system may include a transmission or reflection geometry. An aperture, angle filter, or phase mask may also be incorporated into the system of FIG. 5A.

Figure 5B:

Holographic master data mask 520 and/or the imaging system may be moved to spatially multiplex or polytopically multiplex multiple data pages 510 across the media as shown in FIG. 5B. For example, the system may align one or more masks 500 at a first spatial position to record a stack of data pages 510 in holographic master data mask 520 though one or more multiplexing techniques. The system may then be repositioned to record another stack of data pages 510 and so on to complete holographic master data mask 520. Stored data pages 510 may be imaged to a holographic medium with the same plane wave reference used to record.

Placing holographic master data mask 520 near a quasi Fourier transform plane of data mask 500 may reduce interference between pages in the same stack during recording and when data pages 510 are readout, for example, from holographic master data mask 520 and recorded with an HROM medium. This, in turn, may reduce interference between pages of the same stack during readout of manufactured HROM media recorded using the holographic master data mask 520. More specifically, during readout from holographic master data mask 520, a Fourier filter may be advantageously disposed in the Fourier transform plane of the holographic master data mask 520, close to a surface of an HROM medium or the like to filter out high order transform components. For example, a 4-F system may be used to image into a VanderLugt imaging system with a Fourier filter in the Fourier transform plane of the 4-F system. A 4-F system generally includes two lenses that are separated by the sum of their focal lengths, with two dimensional input and output planes located one focal length in front of the lens pair and one focal length behind the lens pair. Using a 4-F system the Fourier plane may also be placed inside the media.

Another advantage of recording HROM media in or near the Fourier transform plane includes increased locational tolerance of the HROM media and a detector during readout. The increased locational tolerance due, at least in part, since the Fourier transform plane is generally shift invariant. For example, it is possible for the Fourier transform plane to be out of position, e.g., by +/−100 microns, in any of x, y, z, and still recover an image aligned to a detector which has much smaller pixels, e.g., ~10 microns. The shift invariance of the Fourier transform plane makes the tolerances greater for readout than conventional systems. In addition, because the information in the Fourier transform plane is uniformly distributed, media defects such as scratches and dust are not as severe a problem for data recovery as when in the image plane.

In one example, the system as described with reference to FIGS. 5A and 5B includes a phase mask in the object beam and uses phase conjugate readout, where the phase mask may provide a degree of piracy protection. For a good quality reconstruction of the stored information, the phase mask is desirably the same or nearly the same phase mask as used when recording, and disposed at the same or nearly the same location in the system. Knowledge of the phase mask and phase mask location allows for protection of the stored information. Further, such protection could be made customer specific, e.g., by recording information for customer X with one phase mask (readable with a specific drive) and customer Y with another phase mask (readable with a different drive). Customer X would not be able to read customer Y's media without a customer Y drive (or knowledge of the particular phase mask and location used in recording).

In another aspect, an exemplary method for recording holographic master data masks includes using confocal multiplexing where each data mask is imaged to a different distance d from the center of the master storage medium. For example, by varying the distance of data mask 500 shown in FIG. 5A or the image of data mask 500 relative to holographic master data mask 520 between recording different layers. Readout may be confocally detected with a filter similar to methods performed with confocal microscopes. Exemplary descriptions of confocal detection are described in U.S. Pat. Nos. 5,202,875, 6,111,828, and 6,272,095, all of which are hereby incorporated by reference in their entirety. Confocal multiplexing techniques may be advantageously combined with volume holographic multiplexing techniques as described above. One potential advantage of holographically implementing multiple layers (image planes) is that the layers do not have to physically be on the storage medium. For example, with current multilevel CD, near-field, or high na systems, the layers are on or inside the media. By imaging or placing the data mask of the data, the layers can appear to a detector or drive as being located outside of the storage medium, inside the medium, or on the medium depending on where the data mask image plane lies during recording. Thus, the usual problem of compensating for spherical aberration due to the change in the amount of substrate that the light travels through may not be necessary and in some instances may be detected without a pickup lens or lenses.

An adjustable lens system as shown in FIG. 3, and described above, for example, may be used for recording to the holographic master data mask 520 as shown in FIG. 5A. Further, the holographic master data mask 520 may be readout by a suitable pickup lens that may translate to image different data pages or layers stored at various distances d. Alternatively, the image and detector planes may be moved to record at varying distances. The holographic master data mask 520 may then be used to holographically record multiple layers on HROM media using confocal multiplexing. Similarly, a holographic storage medium, such as an HROM medium, may be recorded and readout with adjustable lens systems at varying distances from the medium.

Figure 14B:
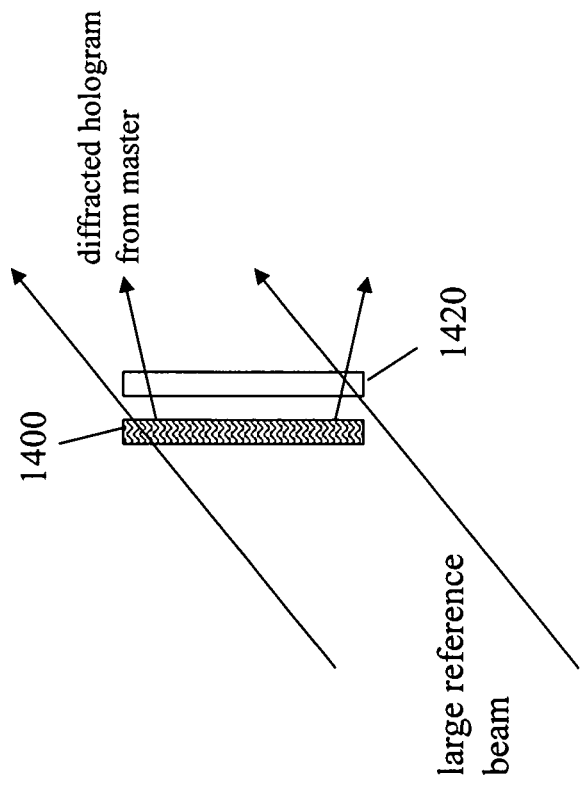
FIGS. 14A and 14B illustrate exemplary methods for forming holographic storage media from a holographic master data mask according to reflection and transmission geometry.
Figure 14A:
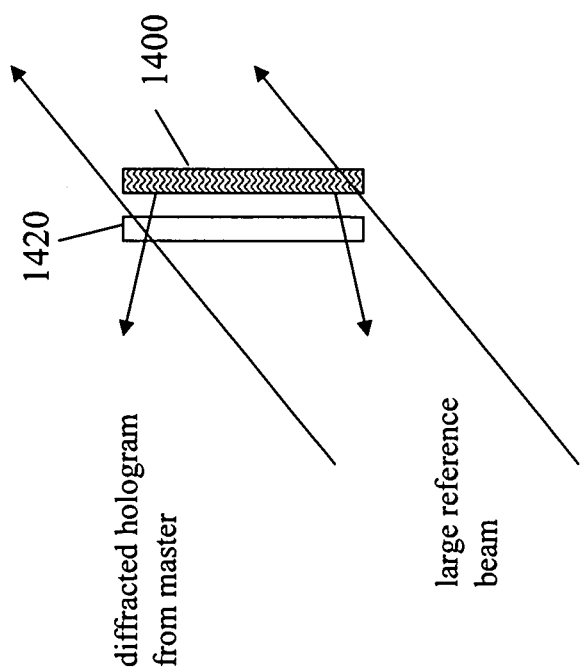

Copying volume holograms from a holographic master, e.g., produced as described with reference to FIGS. 3 and 5A, is illustrated in FIGS. 14A and 14B for reflection geometry and transmission geometry (respectively). Generally, a holographic master 1400 is placed adjacent to a target medium 1420 (e.g., an HROM device) for replication. A reference beam is directed to holographic master 1400 and target medium 1420. The reference beam is sufficient to reconstruct stored holograms in holographic master 1400 and simultaneously store the holograms in target medium 1420. In particular, target medium 1420 is positioned relative to holographic master 1400, such that light from both the diffracted holograms as well as the large reference beam used to read out holographic master 1400 interfere inside target medium 1420, resulting in the same set of holograms being recorded into target medium 1420. There may be some positional offset due to displacement between holographic master 1400 and target medium 1420 during copying. Further, in the case of transmission geometry, as shown in FIG. 14B, the reference beam incident on target medium 1420 may be partially distorted or depleted by the hologram diffraction of holographic master 1400.

A plurality of holograms intended for target medium 1420 can be contained in a single master holographic medium, such as master medium 1400. If the master holographic medium 1400 is recorded by a sequential page-recording process (e.g., as described above with respect to FIG. 3), the holograms may have low diffraction efficiencies for a high capacity storage device, e.g., below 1%. While relatively weak holograms (e.g., having low diffraction efficiencies) may be detectable in a holographic readout system, they are generally inefficient or undesirable for use in a mass replication process. Generally, optimum holographic recording occurs when the object beam and reference beam have near equal intensities. For example, if the object beam intensity from the master holograms is less than 1% of that of the reference beam, the efficiency of the recording in the target medium will be poor, resulting in an inefficient use of the dynamic range of the medium, long replication cycle times, weak holograms that may reduce the readout transfer rate, and the like.

Figure 15A:
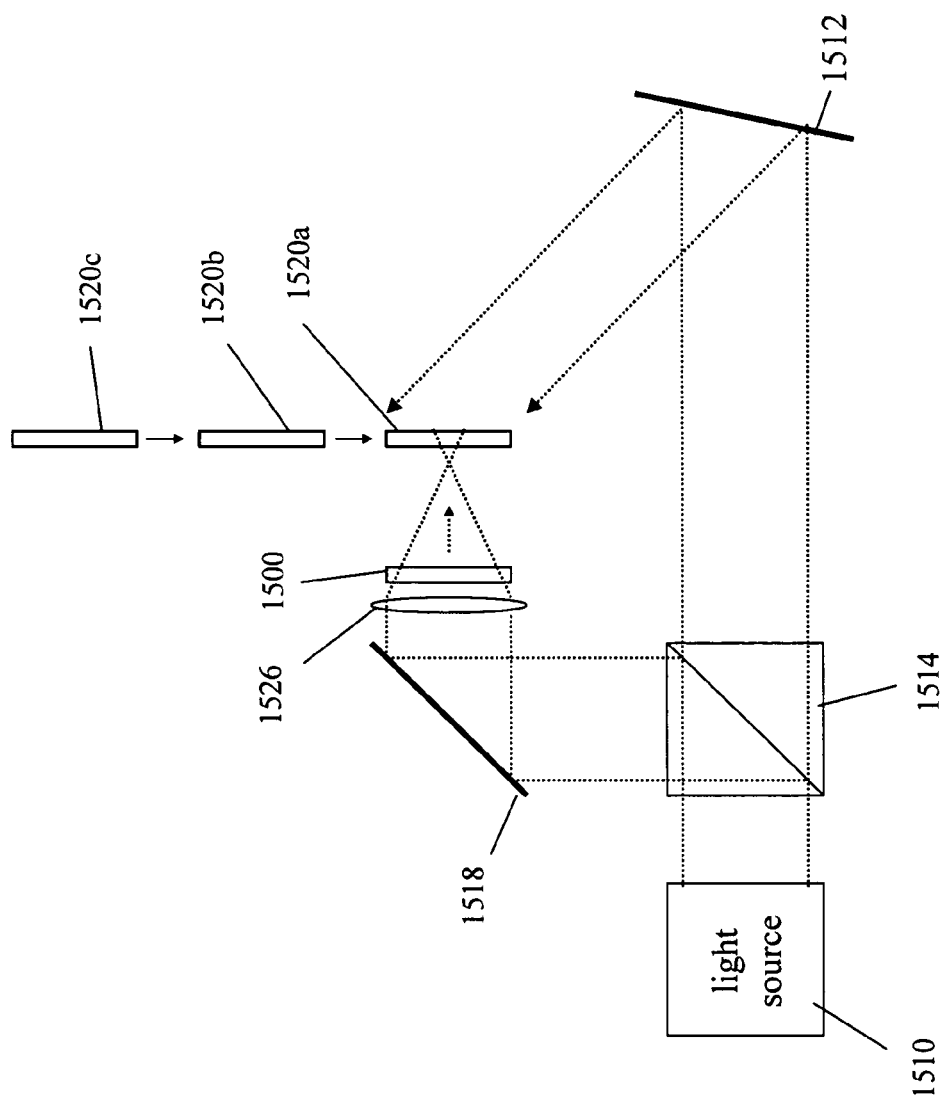
FIGS. 15A and 15B illustrate an exemplary method for recording holograms to a plurality of holographic submaster media and copying the holograms into a single holographic master medium.
Figure 15B:
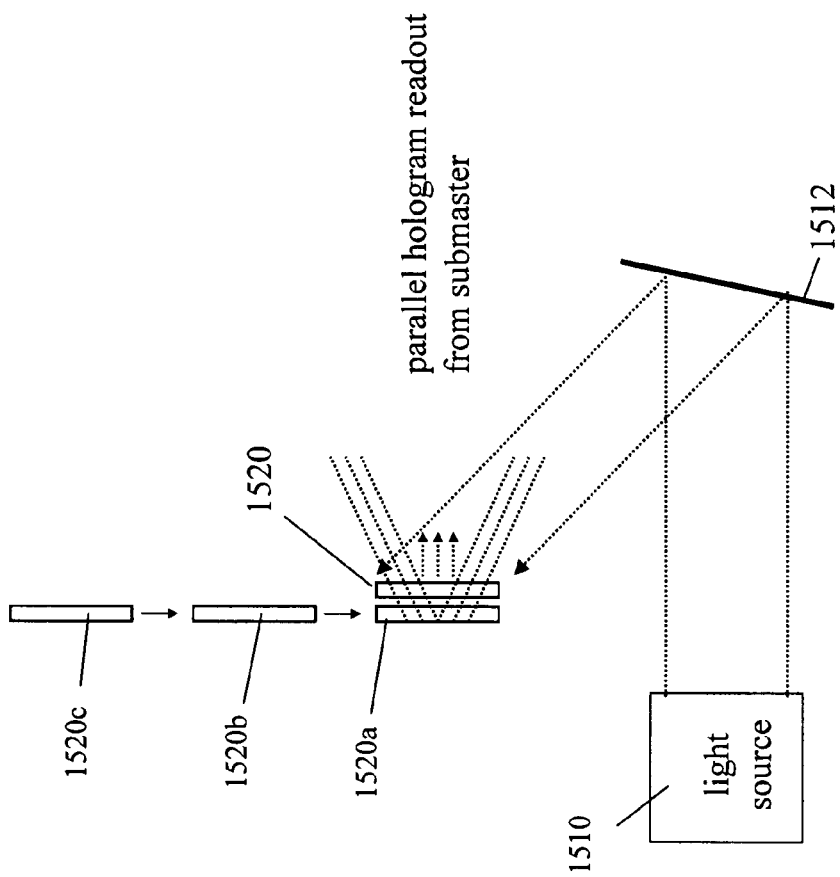

FIGS. 15A and 15B illustrate an exemplary method and system for manufacturing holographic media, including holographic master data masks, which may provide for improved storage capacity and improved hologram diffraction efficiency over previous methods. The exemplary method generally includes a two-step or two-process method for manufacturing a holographic master, wherein a set of holograms or information layers are recorded across a plurality of holographic submasters in a first process, and the set of holograms are recorded or transferred from the holographic submasters to a holographic master in a second process. The master may then be used to manufacture target devices such as HROM devices or the like to include some or all of the set of holograms.

With particular reference to FIG. 15A, a desired set of information layers are recorded sequentially to multiple holographic media or submasters 1520*a-c* in a first process. For example, at least a first hologram is recorded to a first holographic medium 1520*a*, at least a second hologram is recorded to a second holographic medium 1520*b*, and so on. In particular, a light source 1510 provides an object beam directed by beam splitter 1514 and mirror 1518 to a data mask 1500. A lens 1526 directs the object beam illuminate data mask 1500 and to converge to a Fourier plane near the first submaster 1520*a*. Various optical elements and relay systems (e.g., as described herein or otherwise), may be included between light source 1510 and the position of submaster 1520*a*.

Light source 1510 further directs a reference beam to submaster 1520*a* via mirror 1512. A first portion of a set of holograms desired in a final holographic master medium may be stored in the first submaster 1520*a*. The first portion of holograms may include a plurality of holograms stored in submaster 1520*a* through any suitable multiplexing processes. A second submaster 1520*b* may then be suitable positioned to record a second portion of a set of desired holograms, followed by submaster 1520*c* and so on until all desired holograms are stored in holographic submasters.

The example shown in FIG. 15A is for a reflection geometry and recording near a Fourier plane, but the method can be generalized for either transmission or reflection geometry and a variety of recording configurations and multiplexing methods as will be recognized by those of ordinary skill in the art. For example, the holograms may be multiplexed with one or a combination of methods, such as spatial, polytopic, angle, or wavelength multiplexing methods.

The set of holograms stored in holographic submasters 1520*a-c* may then be reproduced and recorded to a single holographic master 1520 (see FIG. 15B) in a second process, which may be used as a holographic master data mask, e.g., to record some or all of the holograms in one or more target devices such as HROM devices or the like. A master holographic medium (in this example, holographic master 1520) manufactured in this manner may be particularly suited for replicating many distribution copies (e.g., HROM devices or the like). For example, limiting the number of holograms recorded to each submasters 1520a-c may preserve stronger diffraction efficiencies in each hologram stored in holographic master 1520.

As illustrated in FIG. 15B, light source 1510 directs a reference beam via mirror 1512 to illuminate both submaster 1520a and master 1520. The holograms stored in submsater 1520a are reconstructed and interfere with the reference beam, thereby stored in master 1520. The system illustrated in FIG. 15B for transferring holograms from submasters 1520a-c to master 1520 may be the same or different than that of FIG. 15A.

In one example, a plurality of holograms stored in submaster 1520a are simultaneously read-out by the reference beam, such that light from the diffracted holograms interferes with the reference beam inside holographic master 1520, resulting in a plurality of stored holograms being transferred or copied to holographic master 1520 simultaneously. In one example, this is repeated for the necessary number of reference beams (for example, with different angles or wavelengths) to transfer all of the holograms from submaster 1520a to master 1520.

Submaster 1520b may then be appropriately positioned adjacent master 1520 and a similar process as with submaster 1520a repeated. It is noted that some alignment processes may be necessary to ensure consistency in the position between different submasters (e.g., 1520a-c) within a desired tolerance; however, alignment processes are only used in the process to produce the holographic master 1520. This is generally preferable to the alternative case where swapping and alignment is needed for multiple data masks or holographic masters during a replication process. Accordingly, with an exemplary holographic master medium as described, replication of additional devices can be produced from a single master, where the proper alignment of the holograms has been previously set during the submaster 1520a-c to master 1520 transfer.

Additionally, the exemplary methods allow more flexibility in the positioning of the final master holographic medium and the replicated or target media relative to the object beam path. With single step mastering, where all holograms are sequentially recorded in the master, efficient use of the media dynamic range is desired to achieve strong holograms for further replication. Therefore, it is generally optimal to record the holographic master as close as possible to a Fourier plane of the object beam, where the overlap between adjacent spatial holograms is minimized. This means, however, that the replicated media must be disposed elsewhere (i.e., away from the Fourier plane), because the holographic master and replicated media cannot share the same physical space during replication. For compact playback drive systems, for example, it may be desirable to have the replicated media very close to the Fourier plane of the diffracted hologram to filter the signal (such as for polytopic multiplexing), while keeping beam paths as short as possible.

Accordingly, in the first submastering process (shown generally in FIG. 15A) of the present example, which is generally sensitive to overlap of adjacent holograms due to the sequential recording of multiple holograms, submasters 1520a-c can be recorded at the Fourier plane to increase the efficient use of the media dynamic range. In the second process (shown generally in FIG. 15B), the master 1520 can be flexibly positioned such that the position does not coincide with the position of submasters 1520a-c or the desired position of the replicated media (e.g., the target). This provides increased freedom for the position of the final replicated media because each of the two mastering steps can be performed with either forward or conjugate readout of the source media.

Figure 16C:
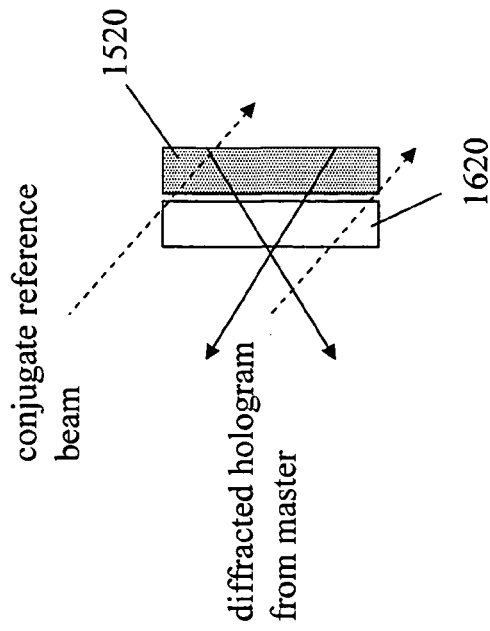
FIGS. 16A-16C illustrate exemplary positioning of data masks and holographic media for manufacturing holographic media from a master holographic data mask and a plurality of submaster media.
Figure 16A:
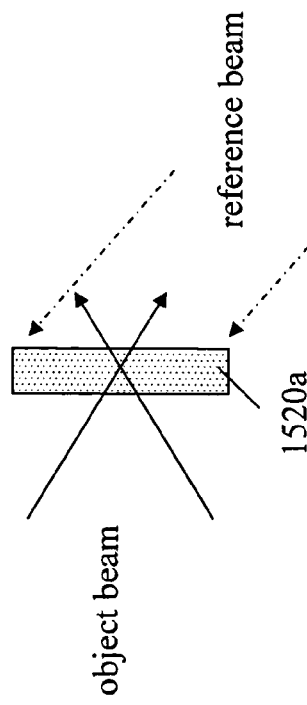
Figure 16B:
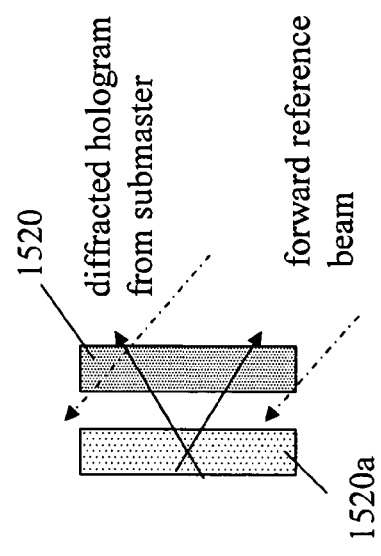

FIG. 16A-16C illustrates exemplary positioning of a holographic submaster 1520a, holographic master 1520, and target medium 1620 in an exemplary mastering and replication processes. The exemplary method includes recording a hologram or information layer with submaster 1520a positioned at the Fourier plane of the object beam as shown in FIG. 16A. The hologram is then transferred or copied from submaster 1520a to master 1520 by a forward reference beam as shown in FIG. 16B. Replication of the hologram from master 1520 to target medium 1620 is shown in FIG. 16C, where target medium 1620 is positioned near the Fourier plane of the diffracted hologram from master 1520, in a position that would generally not be possible with one step mastering due to the positional overlap with submaster 1520a.

Figure 17:
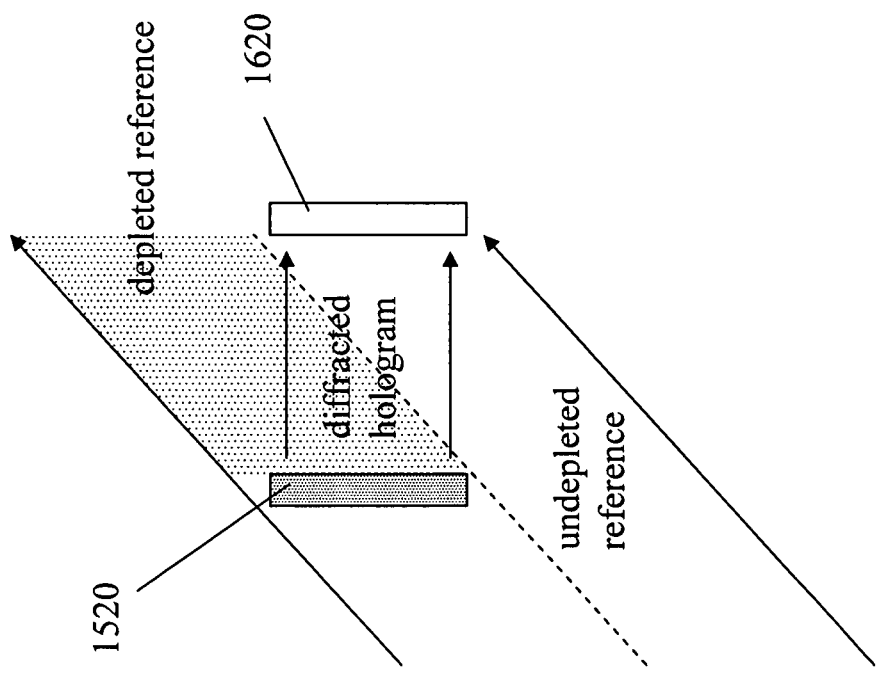
FIG. 17 illustrates an exemplary method for recording and manufacturing holographic media.

Additionally, for the case of transmission geometry, each process of the exemplary method may be performed with the source (e.g., submaster 1520a in FIG. 16B and master 1520 in FIG. 16C) and the target medium (e.g., master 1520 in FIG. 16B and target medium 1620 in FIG. 16C) positioned to ensure that a portion of the reference beam incident on the target media is a portion of the reference beam that is undepleted by the hologram diffraction, as shown in FIG. 17. Such a system allows greater control over relative intensities of the object beam and reference beam used to record the target media.

Alignment of the source media and target media in the various examples descried herein may be carried out with various methods known in the art. One exemplary method for aligning data pixels in a holographic recording system is described in co-pending U.S. patent application Ser. No. 11/069,007, filed Feb. 28, 2005 and entitled "Processing Data Pixels in a Holographic Data Storage System," which is incorporated by reference as if fully set forth herein. These and other alignment processes are possible both during recording and during readout of holograms.

The process of storing a set of holograms across multiple holographic submaster media and then reconstructing and storing the set of holograms in a single holographic master may allow for stronger holograms (e.g., greater diffraction efficiency) to be achieved in the master and replicated media from the master. Two factors that generally affect the strength (e.g., diffraction efficiency) of holograms in a storage medium include the modulation depth with which the holograms were recorded within the medium and the number of overlapping hologram exposures in a unit of volume of the medium.

The modulation depth m of the index grating of a hologram can be written as, $$m = \frac{2\sqrt{I_S I_R}}{I_S + I_R}$$

where $I_S$ and $I_R$ are the object (or signal) beam and reference beam intensities during recording. The modulation depth has a maximum value of 1 when the intensities of the object bean and reference beam are equal. If the intensities are imbalanced, the modulation depth decreases. For example if the intensity ratio is 100:1, the modulation depth is about 0.2, meaning that only about 20% of the dynamic range of the media is effectively contributing to the hologram index modulation. The rest of the dynamic range is essentially wasted as if illuminated with a uniform beam of light. Accordingly, strong holograms with strong diffraction efficiency in a holographic master are important for efficient replication, and in turn producing strong replicated holograms.

Diffraction efficiency η is related to the dynamic range (M/#) of the medium and the number of hologram exposures M overlapped in the media volume. This can be written, $$\eta \approx \left(\frac{M/\#}{M}\right)^2$$

Figure 18:
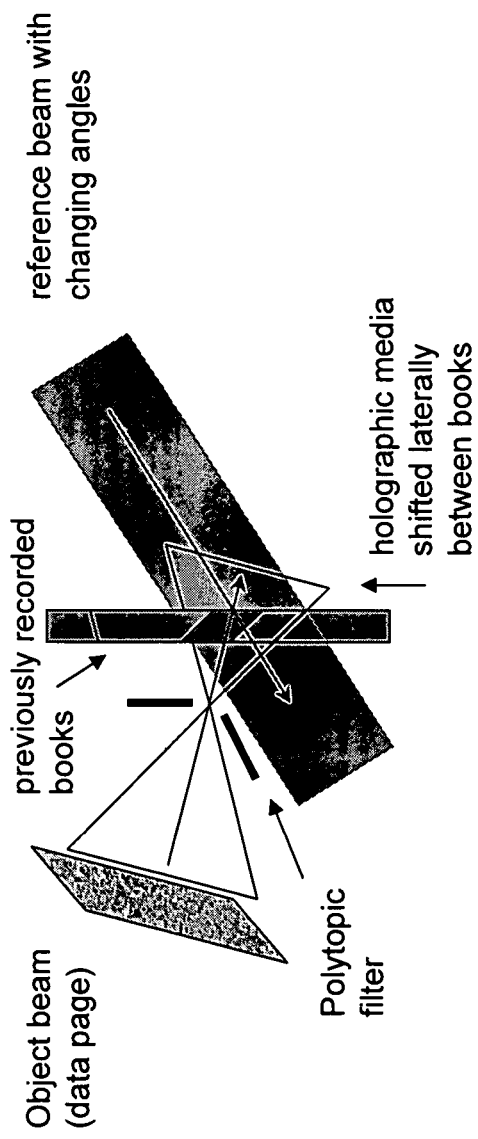
FIG. 18 illustrates an exemplary method for recording and manufacturing holographic media.

If we consider a specific example of recording with a combination of angle and polytopic multiplexing, as illustrated generally in FIG. 18, the number of overlapping exposures M can be further broken down into two components, the number of pages per book (or stack) $N_{page}$, and the spatial overlap factor $N_{overlap}$ of neighboring books.

$$\eta \approx \left(\frac{M/\#}{N_{page}N_{overlap}}\right)^2$$

Accordingly, exemplary methods and systems using multiple submaster media to record a holographic master medium may increase or maximize the diffraction efficiency in a number of ways. With reference to FIGS. 15A and 15B, in the first process of recording multiple submasters 1520*a-c*, each submaster 1520*a-c* may include a fraction of the total number of pages of each book (or stack), but all of the book locations. For example, 30 pages could be divided into 3 submasters 1520*a-c* with 10 pages each. This effectively multiplies the available dynamic range, M/#, by the number of submasters utilized. Additionally, because submasters 1520*a-c* can be recorded at the Fourier plane, where the object beam size is smallest, the spatial overlap, $N_{overlap}$, can be minimized or reduced. For high NA systems, even recording at a small offset from the Fourier plane can raise the overlap factor dramatically.

In the second process (e.g., transferring holograms to the master medium), a broad planewave reference beam with a certain incidence angle may be used to transfer all hologram pages with that reference angle from all books in the particular submaster 1520*a-c* to master 1520 simultaneously. Only one holographic master 1520 is used, so there is no multiplier for the dynamic range M/#. However, the spatial overlap, $N_{overlap}$, effectively becomes 1, because spatially neighboring (polytopic multiplexed) pages are not exposed separately in this step. All spatial holograms with the same reference angle are recorded in parallel to the master 1520, effectively as one hologram.

The desirability of the exemplary methods may be illustrated by considering a polytopic-multiplexed holographic system using a 1.5 mm thick recording medium with a dynamic range (M/#) of 45, which is typical for the current state of the art holographic recording medium. Using a lens of reasonably high NA, e.g., around 0.50, to Fourier transform the object beam, and spacing adjacent hologram stacks by a Nyquist area factor of 1.2 (or 1.08 linear factor), the overlap factor $N_{overlap}$ may be about 20, even when recording exactly at the Fourier plane of the object beam. Recording with the medium even 4-5 mm offset from the Fourier plane, $N_{overlap}$ quickly increases to 100 or more due to the fast divergence of the high NA transform. If each hologram stack contains $N_{page}$=40 holograms (such as by angle or wavelength multiplexing), we can estimate the hologram diffraction efficiencies by the above equation to be about 0.3% when recorded exactly at the Fourier plane, and only about 0.01% when recorded a few millimeters off the Fourier plane. If, in addition to recording at the Fourier plane, the hologram is further divided into pages of 5 submasters as described herein (effectively raising the available M/# to 5×45=225), the diffraction efficiencies can be raised up to about 8%.

With the 2-step mastering method described herein, the holograms stored in these multiple submasters are the reconstructed and recorded to a single holographic master. Achieving approximately 8% diffraction efficiency from the submasters, the modulation depth for recording in the master is about 0.5, such that the effective M/# available in the master is half the original value of 45. The overlap factor can be ignored when copying the polytopically multiplexed pages in parallel to the master such that 40 pages can be recorded to the master with an increased diffraction efficiency of over 30%. This higher diffraction efficiency allows even higher modulation depth for the replication process, such that the diffraction efficiencies could be amplified yet again to the final replicated copies, theoretically even close to 100%.

In contrast, a master produced without the use of holographic submasters as described, e.g., using a single holographic medium and recording the holograms page by page, the diffraction efficiencies of the holograms in the master will be well under 1% at reasonably high data storage densities (e.g., 0.3% in the above example, even when recording at the Fourier plane). At 0.3%, the modulation depth for replicating from such a master will be about 0.1, meaning that only 10% of the M/# of the master media is effectively available. For 40 pages, the diffraction efficiencies of the final replicated holograms will then be limited to under 2% diffraction efficiency.

The diffraction efficiency of the final replicated media is important for enabling fast data transfer rates in the playback drive, especially in low-power consumer devices where the available readout laser power may be limited. Media produced by the method of this invention may have increased hologram diffraction by over an order of magnitude in intensity, with a corresponding reduction in the required integration time of the detector, and hence increase in achievable transfer rate. Accordingly, in one example, the average diffraction efficiency of a set of holograms recorded in a master (or the target media) is greater than 5%, where the areal storage density of the holographic recording material is greater than 10 bits/um$^2$. In another example, the average diffraction efficiency of the set of holograms is higher than (M/N)$^2$, where M is the dynamic range (M/#) of the storage medium without the plurality of holograms (e.g., the blank medium prior to recording) and N is the average number of overlapping holograms recorded the storage medium.

Accordingly, recording a desired set of holograms to more than one piece of holographic media, e.g., multiple submasters, in a first process may allow stronger holograms (e.g., greater diffraction efficiencies) to be recorded in each individual submaster than if they were all recorded sequentially into a single medium. The stronger holograms generally allows more optimal beam intensity ratio between the object and reference beams for transferring the holograms from the multiple submasters to a master, and more efficient use of the dynamic range of the master. Also, because the second process transfers many holograms in parallel from the submaster to the master, the effective number of hologram recordings is reduced. The combination of these benefits may allow hologram strengths to be amplified from the submasters to the holographic master.

Figure 6:
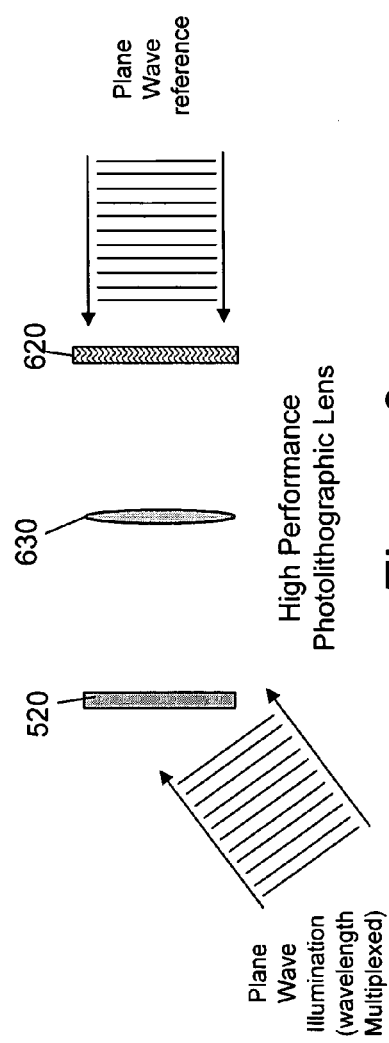
FIG. 6 illustrates an exemplary system for imaging a master holographic data mask to holographic storage media.

With reference now to FIG. 6, an exemplary system and method for recording with a holographic master data mask 520 (which may be manufactured as described with reference to FIG. 5 or as described with reference to FIGS. 15A and 15B) to store data in holographic storage medium 620, e.g., HROM storage media. The holographic master data mask 520 may be illuminated with a plane wave beam and multiplexed depending on how the data masks where stored therein, e.g., wavelength multiplexed, to image various data masks onto holographic storage medium 620. The holographic master data mask 520 is thus the data source that is recorded in the replicated holographic storage medium 620. The plane wave, encoded by a data mask of holographic master data mask 520, may be imaged, relayed, or propagated to holographic storage medium 620 by lens 630. Lens 630 may include a high performance photolithographic lens. Alternatively, the holographic master data mask 520 may be placed in proximity to the storage medium 620 and recorded without a lens (natural beam propagation). Holographic storage medium 620 is further illuminated with a plane wave reference beam to interfere with the encoded beam and store the data from holographic master data mask 520. It should be recognized that various other systems and configurations are possible and contemplated to record with holographic master data mask 520.

An advantage of a Fourier transform plane in recording the holographic master data mask 520 includes that large pixels can be used and a small hologram may be recorded in the holographic master data mask 520 and then copied into the replicated holographic media 620. Additionally, an advantage of a VanderLugt imaging system is that it can form an image outside the storage medium 620 and with the information layer in the quasi Fourier plane (small) that may be readout with a phase conjugate reference beam or with a standard reference beam. The present VanderLugt system is illustrative only and any system that results in a Fourier Transform or quasi Fourier Transform plane will include similar advantages. A VanderLugt system is desirable in part because if a phase conjugate beam is used for readout, lenses are not required in a drive.

Figure 7:
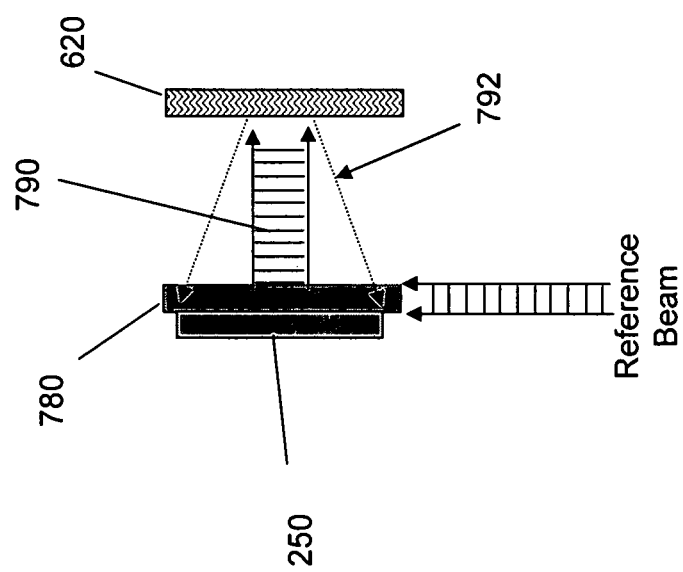
FIG. 7 illustrates an exemplary system for reading holographic storage media including a holographic optical element.

FIG. 7 illustrates a phase conjugate readout of holographic storage medium 620 created with the exemplary system of FIG. 6, e.g., including a VanderLugt imaging system. A detector 250 may be placed opposing holographic storage medium 620. In this example, a Holographic Optical Element (HOE) grating 780 is placed adjacent detector 250. The reference beam illuminates HOE grating 780 from the side and is directed from HOE grating 780 to the storage medium 620 thereby providing the phase conjugate beam 790. A phase conjugate image 792 is reflected back to detector 250 from storage medium 620 for readout. Use of HOE grating 780 or other similar grating to introduce the readout reference beam into the optical path allows for readout in a relatively compact system.

In other examples, standard beamsplitters, polarizing beamsplitters, waveplates, gratings, and the like at various angles may also be used to introduce the reference beam into the system as will be recognized by those of ordinary skill in the art.

Another exemplary method for recording holographic storage media that may be readout without the use of a lens includes storing multiple image planes or layers at a distance from the holographic storage medium located outside of the storage medium as described above with reference to FIG. 3. A detector may be advantageously placed at the distance the image was stored and detect a portion or the entire stored image, e.g., an entire data page or more in parallel. In one example, each storage layer of a holographic storage medium is imaged to the same distance 'd' from the data mask as shown in FIG. 3. In an example where the holographic storage medium includes a holographic master data mask, each level of a holographic storage medium recorded with the holographic master data mask, e.g., an HROM, may be recorded such that the holographic master data mask is imaged to the same distance d from the HROM.

The exemplary method does not require a lens during readout of the holographic image from the storage medium. Specifically, a detector may be placed at distance d from the holographic storage medium, and an image may be readout directly to the detector without the need for a lens. A further advantage includes that an entire page of data can be readout to a detector in parallel. By imaging off the media on or before the image plane, the normal holographic reconstruction is then naturally imaged without the need for a lens. For example, if an image plane of the system is before the media and no lenses are disposed there between, a phase conjugate wave may be used to generate an image without a lens at that image plane for readout. If the drive has a detector at that image plane the pages in that stack can then be detected and the information in that stack of pages readout. Other stacks are addressed by moving the camera relative to the media to the other stacks that were recorded on to the media during replication. In other examples, the use of a phase conjugate wave may be used for readout with a lens or optical imaging elements.

Another exemplary recording method for holographic storage media such as HROM media or holographic master data masks includes polytopic multiplexing. Polytopic multiplexing, described in the above referenced U.S. Patent Application 60/453,529, which is incorporated by reference herein, is an exemplary method to increase the layer density by making the individual data page stacks smaller spatially. Polytopic multiplexing may be used in conjunction with wavelength, angle, fractal, or other holographic multiplexing techniques. Polytopic multiplexing methods allow holograms to be spatially multiplexed onto a holographic material with partial spatial overlap between neighboring holograms and/or stacks of holograms. Each individual stack of data pages may additionally take advantage of an alternate multiplexing scheme such as angle, wavelength, phase code, peristrophic, or fractal multiplexing. Generally, the holograms are separated by an amount equal to the beam waist of the data beam writing the hologram. Unlike more traditional approaches, however, the beam waist is intentionally placed outside of the holographic media such that there is significant beam overlap between stacks inside the media. Upon reconstruction, the data pages and its neighboring data pages will all be readout simultaneously, however, an aperture (filter) placed at the beam waist of the reconstructed data filters out the neighbors that are readout such that only the desired data is detected. Polytopic multiplexing may be implemented with the beam waist inside of the media with the aperture(s) placed at another Fourier plane or by using an angle filter that filters out the neighboring data page reconstructions.

The holograms can be multiplexed by combinations of the standard multiplexing techniques as well as by polytopic multiplexing. Significant increases in storage density may be achieved particularly for thick media and high numerical aperture optical systems where spot sizes are relatively small. Previous techniques were limited in their ability to spatially separate stacks of holograms due to significant amounts of beam divergence. High numerical aperture optics, despite the small beam waist, expand very quickly. The spatial separation of stacks in the prior art was generally limited by the size of the beam in the media after expansion and not limited by the spot size. Up to this point, there has generally been a tradeoff between media thickness (and therefore dynamic range) and the lens numerical aperture. Therefore, there is saturation in achievable capacity that can be obtained for any holographic storage system using the approaches given by the prior art. The polytopic methods described here allow a system to fully utilize high numerical aperture lenses and independently choose the media thickness and therefore gain in both bit density and media dynamic range.

Figure 8:
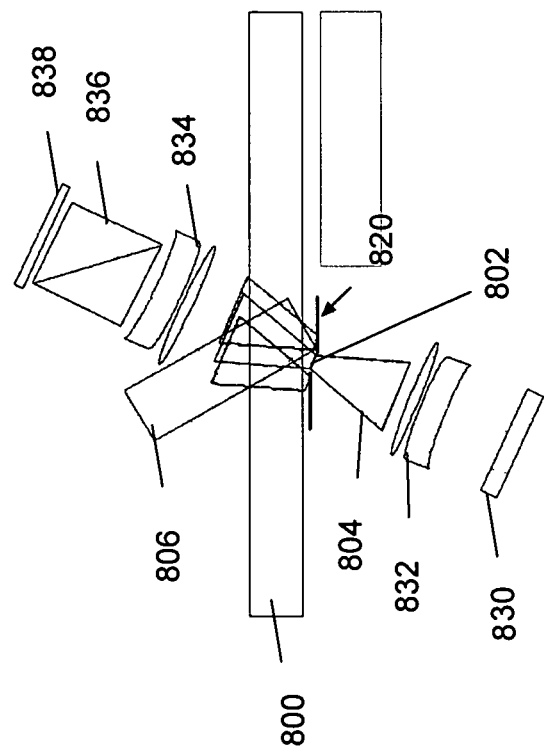
FIG. 8 illustrates an exemplary system and method for reading images from holographic storage media.

FIG. 8 illustrates an exemplary readout system using a phase conjugate reference beam that may filter or block unwanted reconstructions. As shown in FIG. 8, a block 820 at the beam waist 802 will block out the unwanted reconstructions as reference beam 806 is incident on holographic storage medium 800. FIG. 8 shows a Fourier transform arrangement, including a detector 830, Fourier transform lenses 832, 834, a beam splitter 836, and SLM 838. It should be recognized, however, that this system could be used with an imaging system as well.

In this example the full multiplexing (angle, wavelength, etc) of the stack can be used and the stacks can be placed a minimal distance from each other that is not determined by the thickness of the medium 800. This allows for increased use of thick films (>100 microns) and is particularly useful for films greater than 400 microns to many millimeters.

In addition, the stacks do not have to be recorded fully at one time. For material reasons it may be desirable to partially fill the neighboring stacks and then come back and completely fill a stack as the neighborhood of the stack is recorded. See, e.g., U.S. patent application Ser. No. 09/588,908, "Process for Holography Involving Skip-Sorted Hologram Storage," which is hereby incorporated by reference as if fully set forth herein.

The exemplary method may also be used with high numerical aperture lenses or holographic optical elements that function as lenses. The holograms can be recorded in a reflection or transmission holography geometry process. It should be further recognized by those of ordinary skill in the art that the exemplary system and polytopic methods may be employed without a phase conjugate reference beam.

Figures 9A, 9B:
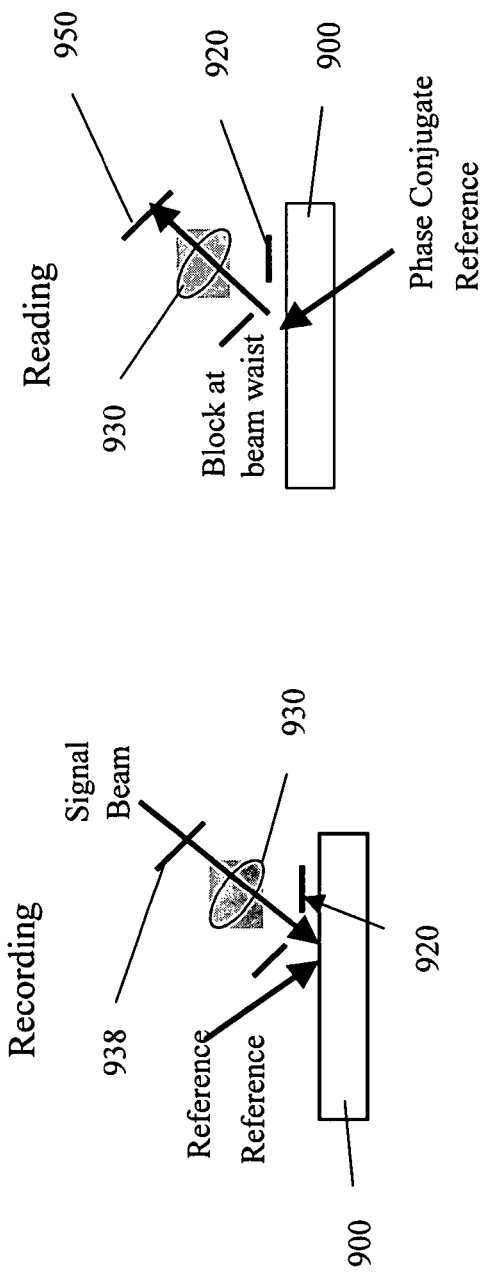
FIGS. 9A and 9B illustrate exemplary systems and methods for recording and reading holographic storage media.

FIGS. 9A and 9B illustrate another exemplary recording and reading method. In this example, polytopic multiplexing is used with phase conjugate readout beam to enhance high order filtering, where the data encoded signal beam is focused in front of the medium 900 as opposed to behind the medium 900 as previously discussed. The focus location is where the beam block 920 is now placed. This has the additional benefit of blocking unwanted higher orders diffracting from a SLM or data mask. The beam then propagates into the media and is holographically recorded with the reference beam as shown in FIG. 9A. Multiplexed holograms may then be recorded at one location by a Bragg multiplexing method (angle, wavelength, etc). Media 900 is moved by an amount given by the dimension of the beam waist and then another stack may be recorded. Upon readout, the phase conjugate readout is used as the input reference beam and this reconstructs a backwards-propagating signal beam that retraces the path of the original recording to detector 950. The block 920 separates out the unwanted reconstructions from the desired signal beam.

The exemplary methods may be implemented with Fourier plane or image plane filtering at or near the planes. It may also be implemented with a single lens, two or more lens, or with a VanderLugt imaging system that has no lens when reading out. This may also be relayed with a quasi Fourier plane filter in the relay and the Fourier plane of the hologram plane near or in the storage media.

A detector for detecting a stored image without a lens, e.g., similar to that described with reference to FIGS. 4, 5A, 7, 9A, and 9B, is generally matched for certain imaging specifications associated with the stored image, which may be determined by the SLM used to modulate the object beam and store the image. For example, the pixel size and pitch of the SLM or data mask are matched to a sensor array of the detector for a pixel-matched readout. Alternatively, the pixel size and pitch may correspond to a desired ratio for an over-sampled readout. Typically, CMOS detector technology can currently provide arrays with pixel pitch on the order of 6 μm, whereas SLM devices typically have pixel pitches of 10 μm or higher, such that finding an exact match of SLM and camera devices is not always possible or cost effective. Accordingly, in some applications it may be desirable to magnify an object image to an output image size to be stored with a suitable holographic medium; for example, to match a desired read out size for a desired detector characteristic, sampling characteristic, or the like.

Figure 10:
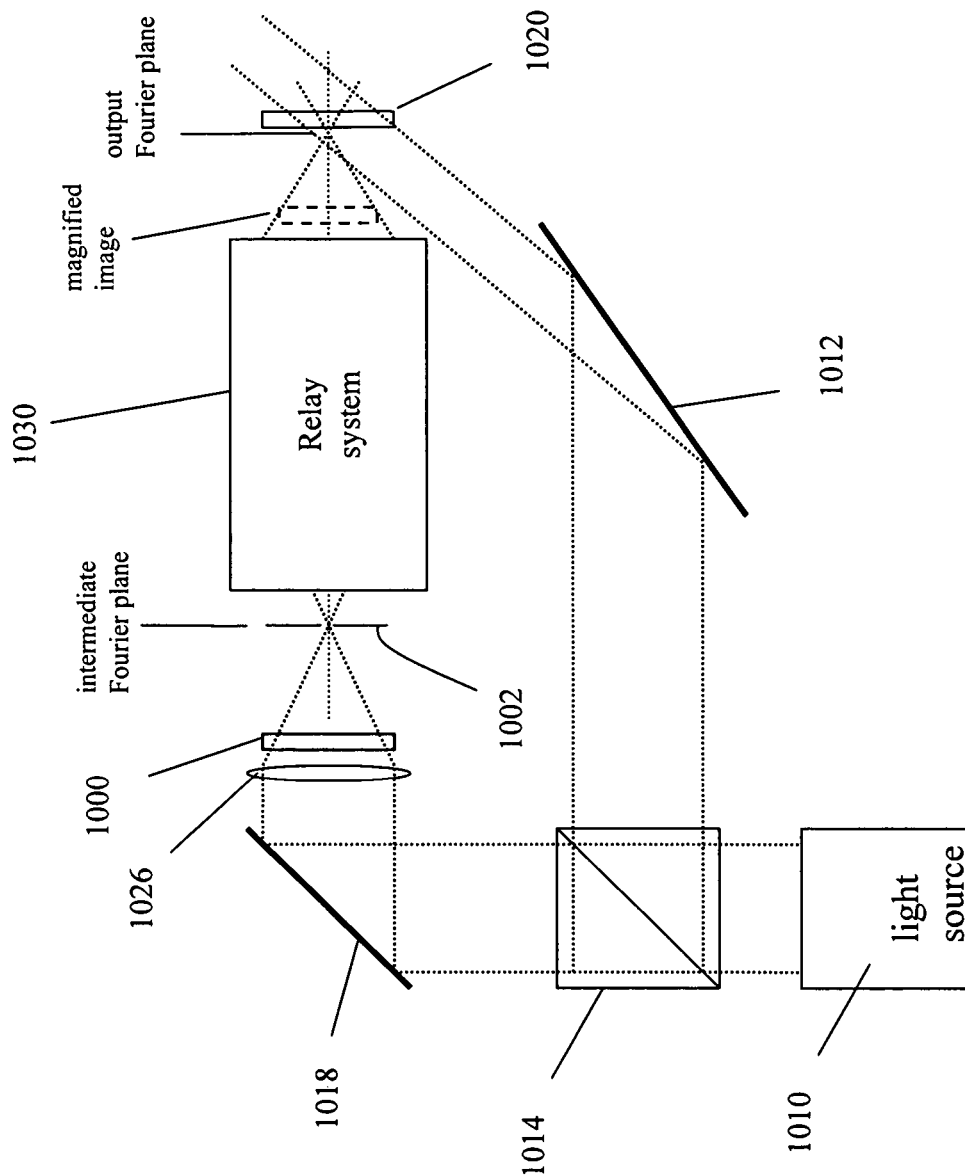
FIG. 10 illustrates an exemplary system and method for recording holographic storage media including a relay system to provide a magnified output image of an object.

FIG. 10 illustrates an exemplary holographic recording system that includes a relay system 1030 for relaying an input object (e.g., a data mask or other means for modulating an object beam) to a magnified or demagnified output image. In this particular example, relay system 1030 is included in the object beam path to reduce the size of the object image, e.g., a data mask 1000, to a desired magnified image size for storage in holographic medium 1020. The hologram may thereafter be reconstructed and readout at the magnified size. Further, the output image of relay system 1030 may converge to a Fourier plane, where the output image may be real or virtual, and may be on either side of the output Fourier plane. The exemplary system including relay system 1030 may further facilitate an intermediate Fourier plane disposed prior to the output Fourier plane where a filter or aperture may be placed, for example.

Generally, an object beam is propagated from light source 1010 (e.g., a coherent light source) and directed via beamsplitter 1014 and mirror 1018 to lens 1026. Lens 1026 directs the object beam to data mask 1000 to encode the object beam with an information layer, which may include one or more pages of data as described herein. Additionally, lens 1026 directs the object beam to an intermediate Fourier plane positioned prior to relay system 1030 and the output Fourier plane, where filter 1002 may be placed (as discussed in greater detail below).

Relay system 1030 is configured in this example, to demagnify the modulated objected beam to a smaller output magnified image. Various magnifications or demagnifications are possible and contemplated. For example, the magnification of the object image may be between 0.2 and 5.0. Additionally, in some examples, relay system 1030 may be operable to relay the object beam without magnification (e.g., a magnification of 1.0). Such a system may benefit from the position and configuration of the intermediate and/or output Fourier planes (e.g., with the use of a phase mask and/or filter).

The output image of relay system 1030 is directed to converge at an output Fourier plane located near or within holographic storage medium 1020. The output image interferes with a reference beam at storage medium 1020, thereby storing the output image within storage medium 1020. In this example, the reference beam is directed from common light source 1010 and directed via beamsplitter 1014 and mirror 1019 to storage medium 1020. It is noted that FIG. 10 is drawn for the specific case of transmission geometry, but the examples described are equally applicable for both transmission and reflection geometry holographic recording systems as will be recognized by those of ordinary skill in the art.

In one example, a filter 1002 (e.g., for polytopic multiplexing or the like) may be placed at the intermediate Fourier plane to filter the object beam, thereby allowing the output Fourier plane to be located inside or very close to storage medium 1020. Typically, holograms cannot be recorded at or very close to the Fourier plane of the image if a filter (e.g., for polytopic multiplexing) is used near the Fourier plane. See, for example, the system described with reference to FIG. 9A. Recording away from the minimum waist of the object beam, however, results in relatively larger holograms, which lowers storage density or increases overlap between neighboring holograms leading to less efficient use of the dynamic range of the media. Thus, placing filter 1002 at the intermediate Fourier plane allows more freedom in the placement of the output Fourier plane with respected to storage medium 1020.

In one example, filter 1002 includes an aperture placed at the intermediate Fourier plane. The aperture includes at least one dimension (e.g., diameter, width, height, etc.) having a size between 0.5 to 4.0 times the Nyquist aperture size for polytopic multiplexing (e.g., where the Nyquist aperture size is the smallest aperture dimension satisfying Nyquist's sampling condition such that the spatial frequency sampling on the data mask 1000 is twice the maximum spatial frequency allowed to pass the aperture dimension). Those of ordinary skill in the art will recognize that various other filters and/or aperture dimensions may be placed at or near the intermediate Fourier plane for various other applications and design considerations.

In one example, the illumination of data mask 1000 in the system of FIG. 10 may have a lower Numerical Aperture (NA) than the desired output NA of relay system 1030. This feature may be desirable, for example, in systems employing SLMs that are designed for a specific illumination angle, and may have deleterious effects (such as lower contrast) if illuminated at angles which vary from an expected angle. In one example, the output NA of the relay system is greater than 0.2, and the NA of data mask 1000 or data mask is less than 0.2. Further, in one example, the output image has less than 0.5 waves of aberration and 1% distortion.

Figure 11A:
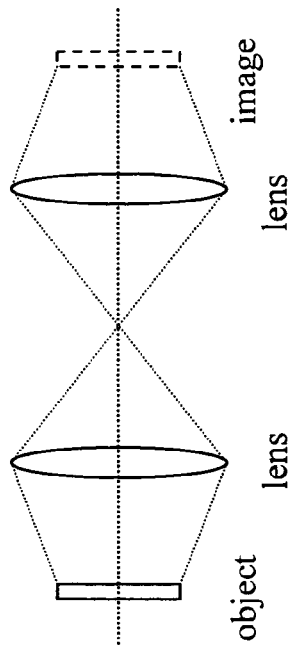
FIGS. 11A-11C illustrate exemplary lens configurations for imaging an object.
Figure 11B:
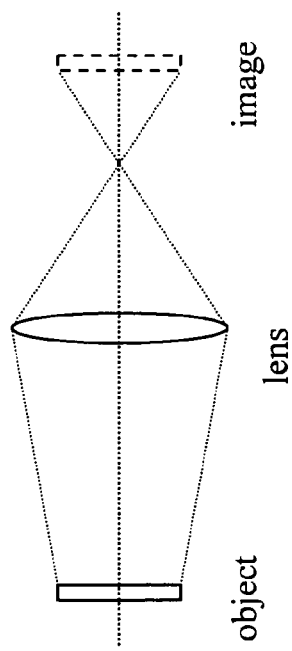
Figure 11C:
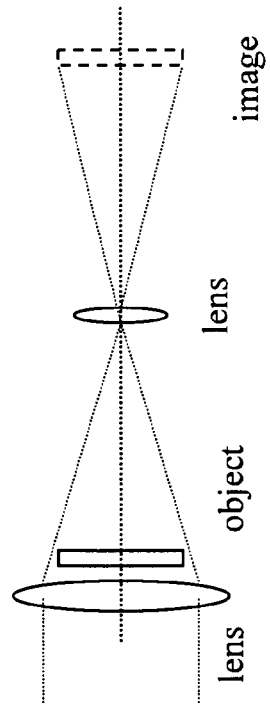

In contrast, conventional imaging systems such as a Z1-Z2, 4-F, and Vanderlugt imaging systems (shown generally in FIGS. 11A-11C respectively) do not generally perform well at high NA over a large field of view, and are generally not optimized for preserving the phase of the image, such as the converging shape of the beam after the image, while at the same time maintaining low aberrations at both the output image and Fourier planes. For example, imaging systems are typically designed with the primary intent of duplicating the intensity of the image, without strict concern for its phase.

With reference again to FIG. 10, the exemplary recording system including relay system 1030 may further allow for insertion of a reference beam in close proximity to the output image (e.g., relative to a recording system without relay system 1030). The addition of relay system 1030 allows the physical data mask 1000 to be moved away from the storage medium 1020, which may allow additional space in the vicinity of the magnified image. For example, a phase mask (not shown) may be disposed in the object path, if desired, and located precisely at the output image plane, thereby more evenly distributing the energy at storage medium 1020 with minimum degradation to image quality. In other examples, a phase mask may be located at data mask 1000.

It is noted that the addition of the relay system 1030 to the recording system does not add complexity to the readout methods and systems. For example, a readout system does not require relay system 1030 for reconstructing holograms stored with storage medium 1020, and may be achieved as described herein with various optical system, without a lens (e.g., a conjugate readout), or the like.

Figure 12A:
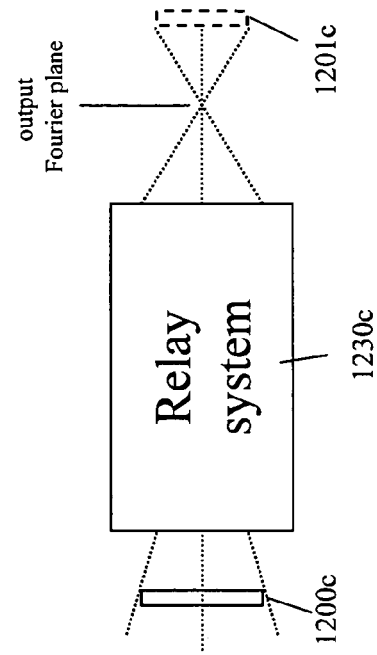
FIGS. 12A-12C illustrate exemplary relay systems for imaging and magnifying an object.
Figure 12B:
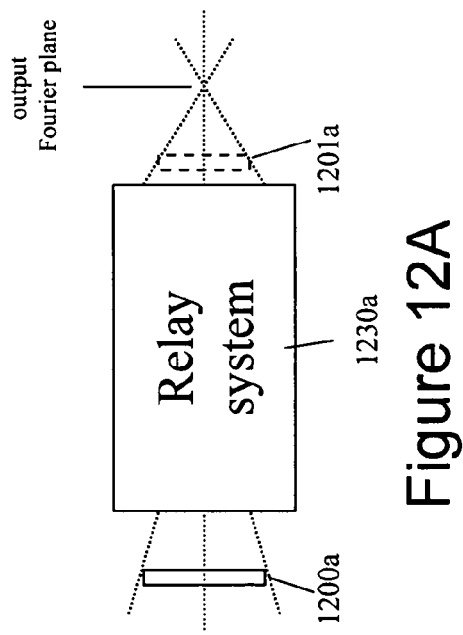
Figure 12C:
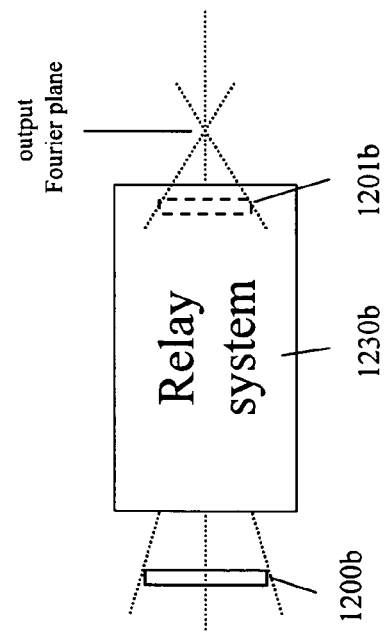

The optical relay system shown in FIG. 10 illustrates an exemplary relay system that creates a magnified (in this example, demagnified) real image of the object prior to the output Fourier plane. In other examples, the output image may be real or virtual, and may be located on either side of the output Fourier plane. FIGS. 12A-12C illustrate exemplary relay systems 1230a-c for use with a holographic recording system to magnify an object image, such as the holographic recording system described with reference to FIG. 10. In particular, FIG. 12A illustrates an exemplary relay system 1230a that creates a magnified real image 1201a of the object 1200a prior the output Fourier plane. FIG. 12B illustrates an exemplary relay system 1230b that creates a magnified virtual image 1201b of the object 1200b prior the output Fourier plane. FIG. 12C illustrates an exemplary relay system 1230c that creates a magnified real image 1201c of the object 1200c after the output Fourier plane.

Figure 13:
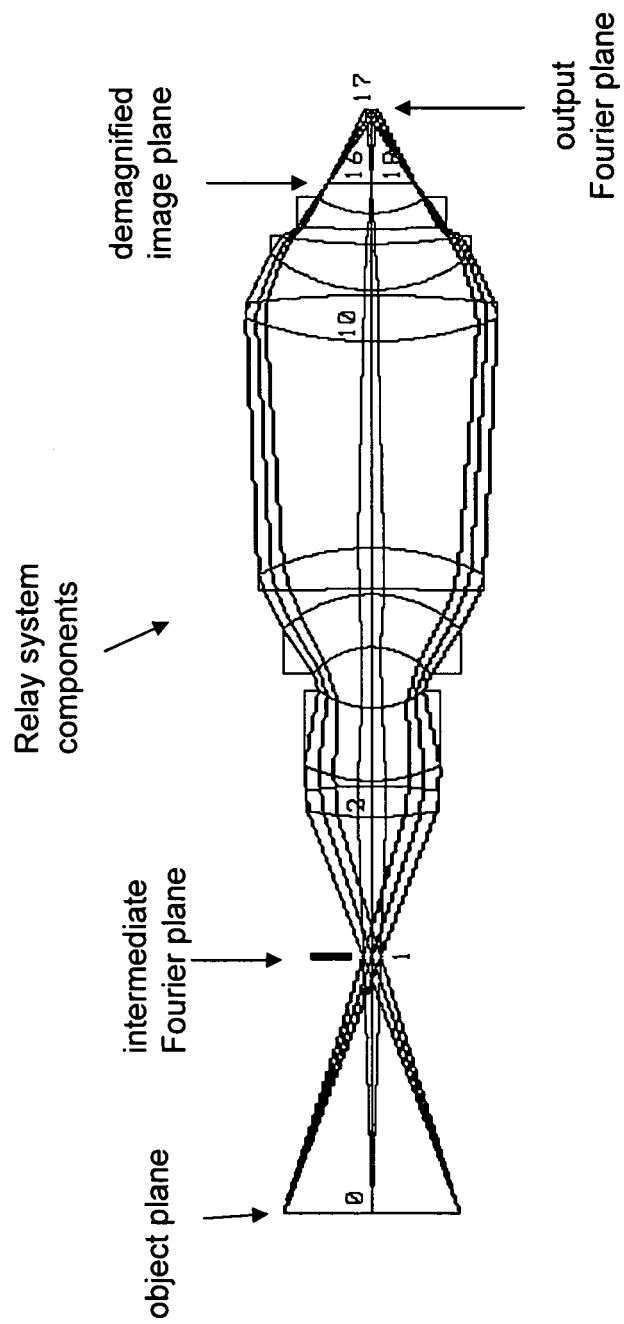
FIG. 13 illustrates an exemplary simulation of a relay system producing a magnified output image.

Relay systems for achieving a magnified image and output Fourier plane may be achieved by numerous constructions of optical elements, including for example, a combination of one or more lenses, prisms, and other suitable optical elements. FIG. 13 illustrate one exemplary lens design simulation for a relay system with a high output NA of 0.5 and magnification of −0.5 times (i.e., demagnification of the object image by 50 percent), while achieving imaging performance of 0.02 waves of error (peak to valley) and 0.02% distortion. The input NA is 0.25, half that of the output NA, and the design allows for access to an intermediate Fourier plane in front of the relay system, for insertion of an aperture such as for polytopic multiplexing or the like. Those of ordinary skill in the art will recognize that a relay system as described herein may be achieved in a numerous manners, including various combinations of optical elements, to achieve the desired functions.

Additionally, holographic recording systems and methods, including a relay system as described herein, may further carry out holographic recording via one or more of polytopic multiplexing, angle multiplexing, wavelength multiplexing, shift multiplexing, correlation multiplexing, confocal multiplexing, or peristrophically multiplexing holograms.

The above detailed description is provided to illustrate exemplary embodiments and is not intended to be limiting. It will be apparent to those of ordinary skill in the art that numerous modification and variations within the scope of the present invention are possible. For example, various methods of recording in holographic media and reading from holographic media may be used in holographic storage systems in isolation or in combination with other methods. Additionally, the apparatus and methods described herein should not be limited to any particular holographic storage system, for example, the methods and systems are generally applicable with various system configurations and multiplexing methods. Accordingly, the present invention is defined by the appended claims and should not be limited by the description herein.

The invention claimed is:

1. A method of recording holograms in a target medium, the method comprising:
sequentially recording first multiple holograms to a first holographic medium, wherein adjacent holograms of the first multiple holograms partially spatially overlap each other;
sequentially recording second multiple holograms to a second holographic medium, wherein adjacent holograms of the second multiple holograms partially spatially overlap each other;

reconstructing the first multiple holograms from the first holographic medium in parallel and recording the reconstructed first multiple holograms in a holographic master medium;

reconstructing the second multiple holograms from the second holographic medium in parallel and recording the reconstructed second multiple holograms in the holographic master medium, wherein said recording the reconstructed first multiple holograms in the holographic master medium and said recording the reconstructed second multiple holograms in the holographic master medium include one or more multiplexing techniques selected from the group consisting of angle, wavelength, confocal, fractal, phase code, and peristrophic multiplexing, such that the reconstructed first multiple holograms overlap the reconstructed second multiple holograms in the holographic master medium; and reconstructing holograms stored in the holographic master medium and recording the reconstructed holograms in the target medium.

2. The method of claim 1, wherein the reconstructed holograms recorded in the target medium include information from the first multiple holograms and the second multiple holograms.

3. A target medium manufactured by the method of claim 2.

4. The method of claim 1, wherein the target medium is a holographic read only medium.

5. The method of claim 1, wherein:

said reconstructing the first multiple holograms from the first holographic medium in parallel includes illuminating the first holographic medium with a first reference beam;

said recording the reconstructed first multiple holograms in the holographic master medium includes illuminating the holographic master medium with the first reference beam;

said reconstructing the second multiple holograms from the second holographic medium in parallel includes illuminating the second holographic medium with a second reference beam; and said recording the reconstructed second multiple holograms in the holographic master medium includes illuminating the holographic master medium with the second reference beam.

6. The method of claim 4, wherein:

the first holographic medium and the holographic master medium are positioned such that a portion of the first reference beam incident on the holographic master medium is undepleted by the first holographic medium; and the second holographic medium and the holographic master medium are positioned such that a portion of the second reference beam incident on the holographic master medium is undepleted by the second holographic medium.

7. The method of claim 5, wherein:

said sequentially recording the first multiple holograms to a first holographic medium includes illuminating the first holographic medium with first object beams characterized by Fourier planes of the first object beams being disposed at the first holographic medium; and said sequentially recording the second multiple holograms to a second holographic medium includes illuminating the second holographic medium with second object beams characterized by Fourier planes of the second object beams being disposed at the second holographic medium.

8. The method of claim 7, wherein said reconstructing holograms stored in the holographic master medium and storing the reconstructed holograms in the target medium is performed with a Fourier plane of the reconstructed holograms residing outside the target medium.

9. The method of claim 7, wherein said reconstructing holograms stored in the holographic master medium and storing the reconstructed holograms in the target medium is performed without a Fourier plane of the reconstructed holograms residing at the target medium.

10. The method of claim 1, further comprising:

recording multiple holograms in a set of N holographic mediums, the multiple holograms including a plurality of holograms in each of the N holographic mediums, wherein:

the set of N holographic mediums includes the first holographic medium and the second holographic medium;

the plurality of holograms of the first holographic medium includes the first multiple holograms; and the plurality of holograms of the second holographic medium includes the second multiple holograms; and sequentially illuminating the each of the N holographic mediums with a reference beam to reconstruct and record the plurality of holograms from the each of the N holographic mediums to the holographic master medium.

11. The method of claim 10, wherein the multiple holograms are recorded in the holographic master medium in an overlapping manner utilizing one or more multiplexing techniques selected from the group consisting of angle, wavelength, confocal, fractal, phase code, and peristrophic multiplexing.

12. A method of storing holograms in a target medium, the method comprising:

recording multiple holograms in each holographic medium in a set of N holographic mediums, wherein the multiple holograms include partially spatially overlapping data page holograms and N is greater than 1;

sequentially illuminating the each of N holographic mediums with a reference beam to reconstruct the multiple holograms in the each of the N holographic mediums and record the reconstructed multiple holograms to the holographic master medium, wherein:

the multiple holograms in the each of the N holographic mediums are reconstructed and recorded in parallel to the holographic master medium;

the reconstructed multiple holograms from one of the N holographic mediums and the reconstructed multiple holograms from another of the N holographic mediums overlap in the master holographic medium by use of one or more multiplexing techniques selected from the group consisting of angle, wavelength, confocal, fractal, phase code, and peristrophic multiplexing;

illuminating the holographic master medium to reconstruct the multiple holograms from the one of the N holographic mediums and record the reconstructed multiple holograms from the one of the N holographic mediums in the target medium; and subsequently illuminating the holographic master medium to reconstruct the multiple holograms from the other of the N holographic mediums and record the reconstructed multiple holograms from the other of the N holographic mediums in the target medium.

13. The method of claim 12, wherein total dynamic range used by the multiple holograms in the one of the N holographic mediums and the other of the N holographic mediums is greater than total dynamic range used by recording the reconstructed multiple holograms from the one of the N holographic mediums and the other of the N holographic mediums to the holographic master medium.

14. The method of claim 13, wherein the target medium is a holographic read only medium.

15. The method of claim 13, wherein the target medium includes multiple copies of holographic read only mediums.

16. A method of preserving dynamic range in a holographic master medium, the method comprising:
sequentially recording first multiple holograms to a first holographic medium, wherein:
adjacent holograms of the first multiple holograms partially spatially overlap each other; and
the first multiple holograms consume a dynamic range first quantity in the first holographic medium;
sequentially recording second multiple holograms to a second holographic medium, wherein:
adjacent holograms of the second multiple holograms partially spatially overlap each other; and
the second multiple holograms consume a dynamic range second quantity in the second holographic medium;
reconstructing the first multiple holograms from the first holographic medium in parallel and recording the reconstructed first multiple holograms in the holographic master medium, wherein said recording the reconstructed first multiple holograms in the holographic master medium consumes less dynamic range in the holographic master medium than the first dynamic range quantity;
reconstructing the second multiple holograms from the second holographic medium in parallel and recording the reconstructed second multiple holograms in the holographic master medium, wherein:
said recording the reconstructed second multiple holograms in the holographic master medium consumes less dynamic range in the holographic master medium than the second dynamic range quantity; and
said recording the reconstructed second multiple holograms in the holographic master medium includes multiplexing the second multiple holograms with the first multiple holograms by use of one or more multiplexing techniques selected from the group consisting of angle, wavelength, confocal, fractal, phase code, and peristrophic multiplexing.

17. The method of claim 16, further comprising reconstructing holograms stored in the holographic master medium and recording the reconstructed holograms in a target medium.

18. The method of claim 17, wherein:
said reconstructing the first multiple holograms from the first holographic medium in parallel and recording the reconstructed first multiple holograms in a holographic master medium includes illuminating both the first holographic medium and the holographic master medium with a first reference beam;
the reconstructed first multiple holograms interfere with the first reference beam to record the reconstructed first multiple holograms in the holographic master medium;
said reconstructing the second multiple holograms from the second holographic medium in parallel and recording the reconstructed second multiple holograms in the holographic master medium includes illuminating both the second holographic medium and the holographic master medium with a second reference beam;
the reconstructed second multiple holograms interfere with the second reference beam to record the reconstructed second multiple holograms in the holographic master medium; and
the reconstructed holograms recorded in the target medium include information from the first multiple holograms and the second multiple holograms.

* * * * *